United States Patent
Sato

(10) Patent No.: US 7,105,275 B2
(45) Date of Patent: Sep. 12, 2006

(54) POSITIVE RESIST COMPOSITION AND METHOD OF FORMING PATTERN USING THE SAME

(75) Inventor: Kenichiro Sato, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 40 days.

(21) Appl. No.: 10/870,220

(22) Filed: Jun. 18, 2004

(65) Prior Publication Data

US 2004/0259028 A1    Dec. 23, 2004

(30) Foreign Application Priority Data

Jun. 18, 2003 (JP) ............ P.2003-173677
Jan. 16, 2004 (JP) ............ P.2004-009104

(51) Int. Cl.
*G03F 7/004* (2006.01)

(52) U.S. Cl. ............ 430/270.1; 430/905; 430/910

(58) Field of Classification Search ............ 430/270.1, 430/905, 910
See application file for complete search history.

(56) References Cited

U.S. PATENT DOCUMENTS

| 6,479,211 | B1 | 11/2002 | Sato et al. | |
| 6,495,307 | B1* | 12/2002 | Uetani et al. | 430/270.1 |
| 6,579,659 | B1* | 6/2003 | Uetani et al. | 430/270.1 |
| 2002/0015913 | A1* | 2/2002 | Uetani et al. | 430/270.1 |
| 2003/0194640 | A1* | 10/2003 | Sato | 430/270.1 |
| 2004/0146802 | A1* | 7/2004 | Yamamoto et al. | 430/270.1 |

FOREIGN PATENT DOCUMENTS

| EP | 1 353 225 A2 | 10/2003 |
| JP | 6-37071 A | 2/1994 |
| JP | 7-252324 A | 10/1995 |
| JP | 9-73173 A | 3/1997 |
| JP | 11-109632 A | 4/1999 |
| JP | 2000-26446 A | 1/2000 |
| JP | 2000-214588 A | 8/2000 |
| JP | 2000-321771 A | 11/2000 |
| JP | 2001-109154 A | 4/2001 |
| JP | 2001-188351 A | 7/2001 |
| JP | 2002-296783 A | 10/2002 |
| JP | 2003-5374 A | 1/2003 |

OTHER PUBLICATIONS

European Search Report dated Oct. 15, 2004.

* cited by examiner

*Primary Examiner*—John S. Chu
(74) *Attorney, Agent, or Firm*—Sughrue Mion, PLLC

(57) ABSTRACT

A positive resist composition comprising (A) a resin that increases solubility in a developing solution by the action of an acid and comprises (a) a repeating unit containing a group that is decomposed by the action of an acid to become alkali-soluble, (b) a repeating unit containing an alicyclic lactone structure, (c) a repeating unit containing an alicyclic structure substituted with a hydroxy group and (d) a methacrylic acid repeating unit, wherein an amount of the methacrylic acid repeating unit is from 5 to 18% by mole based on the total repeating units of the resin, and (B) a compound that generates an acid upon irradiation of an actinic ray or radiation.

9 Claims, No Drawings

POSITIVE RESIST COMPOSITION AND METHOD OF FORMING PATTERN USING THE SAME

FIELD OF THE INVENTION

The present invention relates to a positive resist composition sensitive to a far ultraviolet ray for use, for example, in fine processing of semiconductor devices and a method of forming a pattern using the same.

BACKGROUND OF THE INVENTION

The degree of integration of integrated circuits has recently become much higher, and the processing of superfine patterns having a line width of a half micron or below is required in the production of semiconductor substrate for VSLI, etc. In order to meet such a requirement, a wavelength of light source used in an exposure apparatus for photolithography becomes shorter, and nowadays the use of an excimer laser beam (e.g., XeCl, KrF or ArF) in a short wavelength region of a far ultraviolet ray is investigated.

As a resist for use in the pattern formation by the photolithography in such a wavelength region, a chemically amplified resist is known.

In resist compositions for ArF light source, resins having an alicyclic hydrocarbon moiety introduced for the purpose of providing dry etching resistance have been proposed.

In Patent Document 1 (JP-A-9-73173 (the term "JP-A" as used herein means an "unexamined published Japanese patent application")), there is described a resist material using an acid-susceptive compound containing an alkali-soluble group protected by a structure including an alicyclic group and a structural unit capable of rendering the resin alkali-soluble upon releasing the alkali-soluble group by an acid.

In Patent Document 2 (JP-A-2000-214588) and Patent Document 3 (JP-A-2000-321771), resist compositions comprising a copolymer containing a methacrylic acid or acrylic acid repeating unit and an acid-decomposable repeating unit are described.

In Patent Document 4 (JP-A-2001-188351) and Patent Document 5 (JP-A-2000-26446), resist compositions comprising a copolymer containing a repeating unit having an alicyclic lactone structure are described.

In Patent Document 6 (JP-A-7-252324) and Patent Document 7 (JP-A-11-109632), resist compositions comprising a copolymer containing a repeating unit having an alicyclic group substituted with a hydroxy group are described.

In Patent Document 8 (JP-A-2001-109154) and Patent Document 9 (JP-A-2002-296783), a combination of an acid-decomposable repeating unit, a repeating unit having an alicyclic lactone structure and a repeating unit having an alicyclic group substituted with a hydroxy group is described.

Resins used in photoresist for far ultraviolet ray as described above ordinarily contain an acid-decomposable group and an aliphatic cyclic hydrocarbon group at the same time in the molecules thereof.

With respect to application of such conventional resins having alicyclic hydrocarbon moiety introduced to a resist composition, further improvements in various performances have been desired. Among them, further enlargement of process window of resist for contact hole has been requested.

Further, for the exposure of resist used in photolithography, a reduction production exposure method with a radiation (for example, g-line, i-line or KrF excimer laser beam) has been utilized. In general, resolution (R) of a lens is represented by the following formula according to the Rayleigh's equation:

$R=k[\lambda/N.A.]$

In the formula, $\lambda$ represents a wavelength of exposure light and N.A. represents a numerical aperture of the lens. Designating an open angle of incident light to a wafer as $\theta$, N.A.=sin $\theta$. k indicates a value fluctuating according to a resist and is frequently used as a characteristic parameter exhibiting performances of the resist. According to knowledge on a resist for i-line, k becomes small only as approximately 0.5, even when the resist is improved. As is apparent from the formula, in order to increase the resolution, R must be a small value. For this purpose, it is desired to increase the value of N.A., to decrease the value of $\lambda$ or to decrease the value of k. At the present circumstances, however, the value of N.A. increases to reach almost 0.8 and on the other hand, the value of k reaches the limit of 0.5. In view of making the wavelength for exposure shorter, investigations have been made from 248 nm of KrF excimer laser beam to 193 nm of ArF excimer laser beam. However, even when the ArF excimer laser beam is used, the pattern formation of 100 nm or less becomes theoretically difficult.

Thus, a resist material capable of forming a finer pattern and a method of forming a pattern using a current exposure apparatus have been requested. In response to such requests, a technique including a method of controlling a contact hole size of a semiconductor device wherein a wafer is heated while irradiating with an ultraviolet ray (UV) in vacuo (flow bake) to change a resist shape (flow), thereby reducing a size of resist pattern as described in Patent Document 10 (JP-A-6-37071) appears promising. However, development of resist material suitable for the method is insufficient. Further, since the process of flow bake of a wafer while irradiating with an ultraviolet ray in vacuo is troublesome, a resist material capable obtaining the same effect only by flow bake in the atmosphere has been desired. However, when the flow bake process is applied to hitherto known resist materials, there are problems in that the control of hole size is difficult because of high flow speed and in that the resist materials do not sufficiently flow at a practical flow temperature (180° C. or below).

Recently, it has been further found that pits are frequently formed in a film at the flow bake step. There is fear that the formation of pits causes adverse effects (for example, deterioration of pattern transferability after etching or deterioration etching resistance) on a subsequent etching step. Therefore, it has been desired to prevent the formation of pits.

Patent Document 1 (JP-A-9-73173)
Patent Document 2 (JP-A-2000-214588)
Patent Document 3 (JP-A-2000-321771)
Patent Document 4 (JP-A-2001-188351)
Patent Document 5 (JP-A-2000-26446)
Patent Document 6 (JP-A-7-252324)
Patent Document 7 (JP-A-11-109632)
Patent Document 8 (JP-A-2001-109154)
Patent Document 9 (JP-A-2002-296783)
Patent Document 10 (JP-A-6-37071)

SUMMARY OF THE INVENTION

An object of the present invention is to provide a positive resist composition which resolves problems in original performance improving techniques of the above-described microphotofabrication using a far ultraviolet ray, particularly an ArF excimer laser beam, and a method of forming a pattern using the same.

Another object of the invention is to provide a positive resist composition which provides a wide process window in the formation of contact hole and restrains the formation of pit at the flow bake, and a method of forming a pattern using the same.

Other objects of the invention will become apparent from the following description.

As a result of intensive investigation on constituting materials of chemically amplified positive resist composition, the inventors have found that the objects of the invention can be achieved by the following constitutions to complete the invention.

(1) A positive resist composition comprising (A) a resin that increases solubility in a developing solution by the action of an acid and comprises (a) a repeating unit containing a group that is decomposed by the action of an acid to become alkali-soluble, (b) a repeating unit containing an alicyclic lactone structure, (c) a repeating unit containing an alicyclic structure substituted with a hydroxy group and (d) a methacrylic acid repeating unit, wherein an amount of the methacrylic acid repeating unit is from 5 to 18% by mole based on the total repeating units of the resin, and (B) a compound that generates an acid upon irradiation of an actinic ray or radiation.

(2) The positive resist composition as described in (1), wherein the repeating unit (a) containing a group that is decomposed by the action of an acid to become alkali-soluble contains an alicyclic structure.

(3) The positive resist composition as described in (2), wherein the repeating unit (a) containing a group that is decomposed by the action of an acid to become alkali-soluble is represented by the following formula (I):

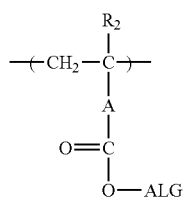

(I)

wherein $R_2$ represents a hydrogen atom or a methyl group; A represents a single bond or a connecting group; and ALG represents a group containing an alicyclic hydrocarbon represented by any one of the following formulae (pI) to (pV):

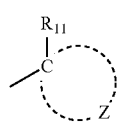

(pI)

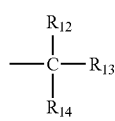

(pII)

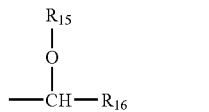

(pIII)

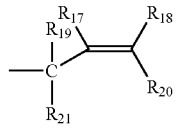

(pIV)

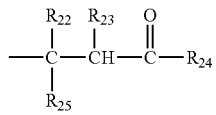

(pV)

wherein $R_{11}$ represents a methyl group, an ethyl group, a n-propyl group, an isopropyl group, a n-butyl group, an isobutyl group or a sec-butyl group, Z represents an atomic group necessary for forming an alicyclic hydrocarbon group together with the carbon atom, $R_{12}$ to $R_{16}$ each independently represent a straight chain or branched alkyl group having from 1 to 4 carbon atoms or an alicyclic hydrocarbon group, provided that at least one of $R_{12}$ to $R_{14}$ or either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group and that either $R_{19}$ or $R_{21}$ represents a straight chain or branched alkyl group having from 1 to 4 carbon atoms or an alicyclic hydrocarbon group; $R_{22}$ to $R_{25}$ each independently represent a hydrogen atom, a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring.

(4) The positive resist composition as described in any one of (1) to (3), wherein an acid value of the resin (A) is from 0.2 meq/g to 0.9 meq/g.

(5) A method of forming a pattern comprising a step of forming a resist film with the positive resist composition as described in any one of (1) to (4), a step of exposing the resist film, and a step of developing the exposed resist film.

DETAILED DESCRIPTION OF THE INVENTION

According to the present invention, a positive resist composition which provides a wide process window in the formation of contact hole and restrains the formation of pit at the flow bake, and a method of forming a pattern using the same can be provided.

The components for use in the positive resist composition of the invention will be described in detail below.

With respect to the description of a group (atomic group) in the specification, the term "group", which is not particularly referred to whether it is substituted or not, means and includes both unsubstituted and substituted groups. For example, the description of "an alkyl group" means and includes an unsubstituted alkyl group and a substituted alkyl group.

[1] Resin that Increases Solubility in a Developing Solution by the Action of an Acid The positive resist composition of the invention contains a resin (A) that increases solubility in a developing solution by the action of an acid and comprises (a) a repeating unit containing a group that is decomposed by the action of an acid to become alkali-soluble, (b) a repeating unit containing an alicyclic lactone structure, (c) a repeating unit containing an alicyclic structure substituted with a hydroxy group and (d) a methacrylic acid repeating unit, wherein an amount of the methacrylic acid repeating unit is from 5 to 18% by mole based on the total repeating units of the resin.

The resin (A) preferably does not contain an aromatic residue. The aromatic residue means a residue having delocalized circular n-electron clouds above and below the molecular plane and being characterized in that the n-electron clouds contain 4n+2 (n represents 0 or a natural number) n-electrons in total as in a compound, for example, benzene, naphthalene or anthracene.

(a) Repeating unit containing a group that is decomposed by the action of an acid to become alkali-soluble The resin (A) is a rein (acid-decomposable resin) that increases solubility in an alkali developing solution by the action of an acid and contains a repeating unit having a group (acid-decomposable group) that is decomposed by the action of an acid to become alkali-soluble.

When an ArF excimer laser beam is used as a light source for exposure, a group represented by formula $-C(=O)-X_1-R_0$ is preferably used as the group that is decomposed by the action of an acid in the resin. In the formula, $R_0$ represents a tertiary alkyl group, for example, a tert-butyl group or a tert-amyl group, an isobornyl group, an 1-alkoxyethyl group, for example, a 1-ethoxyethyl group, a 1-butoxyethyl group, a 1-isobutoxyethyl group or a 1-cyclohexyloxyethyl group, an alkoxymethyl group, for example, a 1-metoxymethyl group or a 1-ethoxymethyl group, a tetrahydropyranyl group, a tetrahydrofuryl group, a trialkylsilyl group, a 3-oxocyclohexyl group or a lactone group. $X_1$ represents an oxygen atom or a sulfur atom, and preferably an oxygen atom.

The repeating unit (a) having an acid-decomposable group preferably contains an alicyclic hydrocarbon structure. As the alicyclic hydrocarbon structure (alicyclic structure), those represented by formulae (pI) to (pV) are preferred.

More preferably, the repeating unit (a) is represented by the following formula (I):

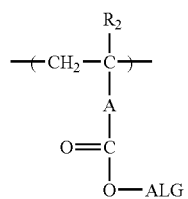

(I)

In formula (I) $R_2$ represents a hydrogen atom or a methyl group; A represents a single bond or a connecting group; and ALG represents a group containing an alicyclic hydrocarbon represented by any one of formulae (pI) to (pV) shown below.

The connecting group represented by A represents an alkylene group, an ether group, a thioether group, a carbonyl group, an ester group, an amido group, a sulfonamido group, a urethane group, a urea group or a combination of two or more thereof. As the alkylene group represented by A, a group represented by the following formula is exemplified.

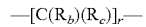

In the formula, $R_b$ and $R_c$, which may be the same or different, each represent a hydrogen atom, an alkyl group, a halogen atom, a hydroxy group or an alkoxy group. The alkyl group includes preferably a lower alkyl group, for example, a methyl group, an ethyl group, a propyl group, an isopropyl group or a butyl group, and more preferably a methyl group, an ethyl group, a propyl group or an isopropyl group. The alkoxy group includes an alkoxy group having from 1 to 4 carbon atoms, for example, a methoxy group, an ethoxy group, a propoxy group or a butoxy group. The halogen atom includes, for example, a chlorine atom, a bromine atom, a fluorine atom and an iodine atom. The alkyl group or the alkoxy group may have a substituent. Examples of the substituent for the alkyl group or alkoxy group include a hydroxy group, a halogen atom and an alkoxy group (preferably having from 1 to 4 carbon atoms). r represents an integer of from 1 to 10.

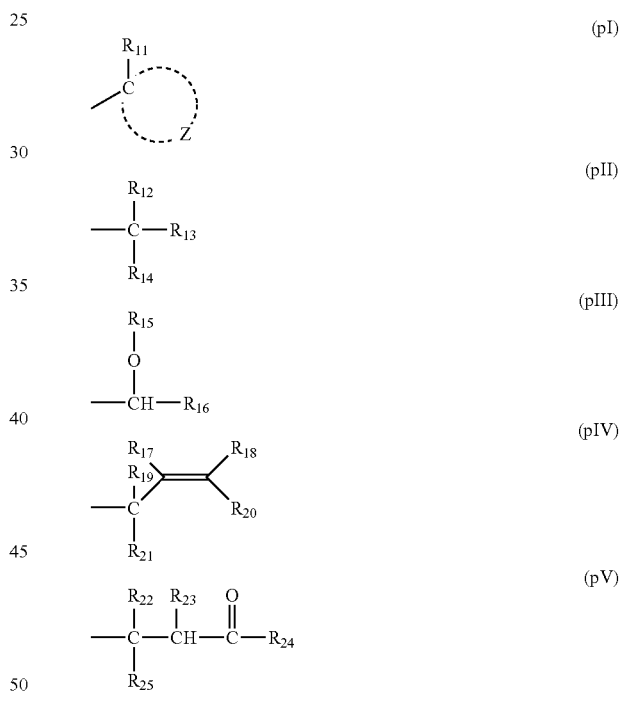

In the formulae, $R_{11}$ represents a methyl group, an ethyl group, a n-propyl group, an isopropyl group, a n-butyl group, an isobutyl group or a sec-butyl group. Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$ or either $R_{15}$ or $R_{16}$ represents an alicyclic hydrocarbon group.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group and that either $R_{19}$ or $R_{21}$ represents a straight chain or branched alkyl group having from 1 to 4 carbon atoms or an alicyclic hydrocarbon group.

$R_{22}$ to $R_{25}$ each independently represent a hydrogen atom, a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring.

In formulae (pI) to (pV), the alkyl group represented by any one of $R_{12}$ to $R_{25}$ includes a straight chain or branched alkyl group having from 1 to 4 carbon atoms, which may be substituted. Examples of the alkyl group include a methyl group, an ethyl group, a n-propyl group, an isopropyl group, a n-butyl group, an isobutyl group, a sec-butyl group and a tert-butyl group.

Examples of the substituent for the alkyl group include an alkoxy group having from 1 to 4 carbon atoms, a halogen atom (e.g., a fluorine atom, a chlorine atom, a bromine atom or an iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocyclo, bicyclo, tricyclo or tetracyclo structure. The number of carbon atoms included therein is preferably from 6 to 30, and more preferably from 7 to 25. The alicyclic hydrocarbon group may have a substituent.

Examples of the structure of alicyclic portion (alicyclic structure) in the alicyclic hydrocarbon group are set forth below.

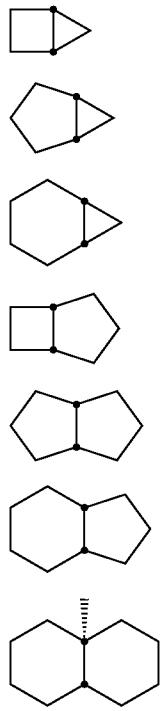

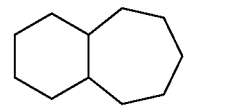

(8)

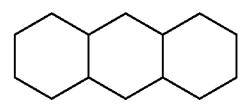

(9)

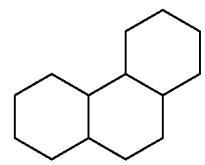

(10)

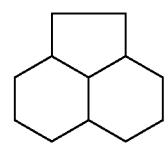

(11)

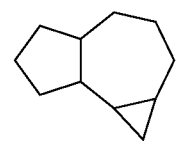

(12)

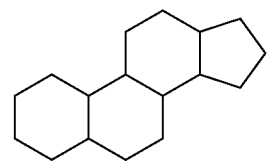

(13)

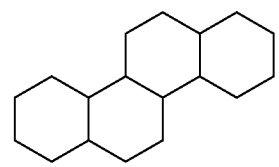

(14)

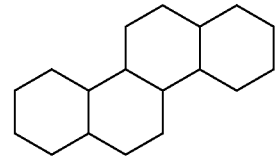

(15)

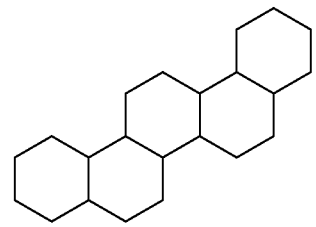

(16)

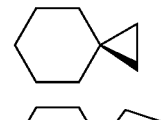

(17)

(18)

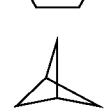

(19)

(20)
(21)
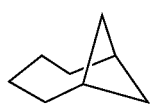
(22)
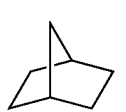
(23)
(24)
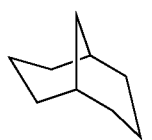
(25)
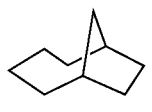
(26)
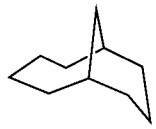
(27)
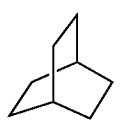
(28)
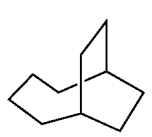
(29)
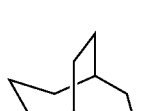
(30)
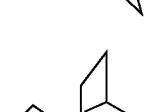
(31)
(32)
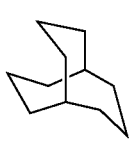
(33)
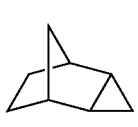
(34)
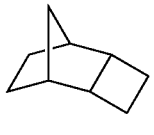
(35)
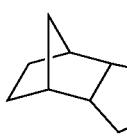
(36)
(37)
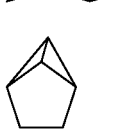
(38)
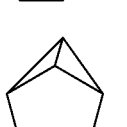
(39)
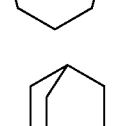
(40)
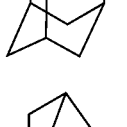
(41)
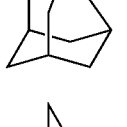
(42)
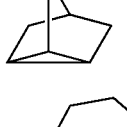
(43)
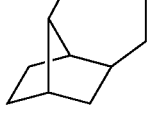

-continued

(44) 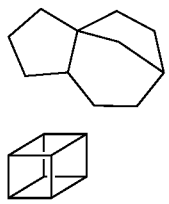

(45) 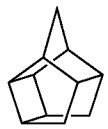

(46) 

(47) 

(48) 

(49) 

(50)

Preferred examples of the alicyclic portion for use in the resin according to the invention include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyclododecanyl group are more preferred.

Examples of the substituent for the alicyclic hydrocarbon group include an alkyl group, a halogen atom, a hydroxy group, an alkoxy group, a carboxy group and an alkoxycarbonyl group.

The alkyl group is preferably a lower alkyl group, for example, a methyl group, an ethyl group, a propyl group, an isopropyl group or a butyl group, and more preferably a methyl group, an ethyl group, a propyl group or an isopropyl group. The alkoxy group includes an alkoxy group having from 1 to 4 carbon atoms, for example, a methoxy group, an ethoxy group, a propoxy group or a butoxy group. The alkyl group or the alkoxy group may have a substituent. Examples of the substituent for the alkyl group or alkoxy group include a hydroxy group, a halogen atom and an alkoxy group.

Of the repeating units represented by formula (I), those wherein A represents a single bond and ALG represents a group represented by formula (pI) or (pII) are preferred.

In the light of low fluctuation (SEM resistance) of pattern size when observed by a scanning electron microscope, repeating units represented by formula (I) wherein A represents a single bond and ALG represents a group represented by the formula shown below are particularly preferred.

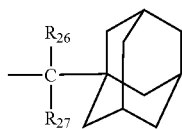

wherein $R_{26}$ and $R_{27}$ each independently represent a straight chain or branched alkyl group having from 1 to 4 carbon atoms.

Specific examples of the monomer corresponding to the repeating unit represented by formula (I) are set forth below.

1
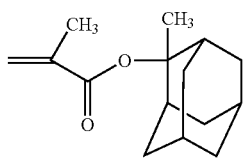

2
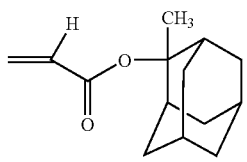

3
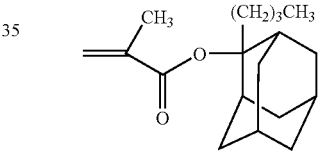

4
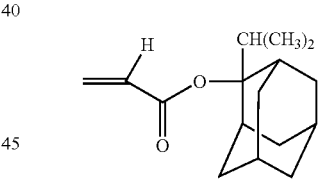

5
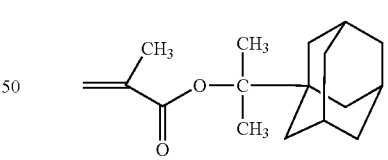

6
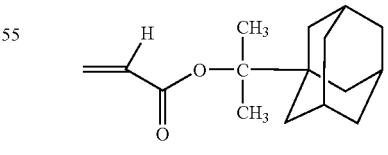

7
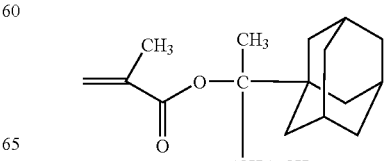

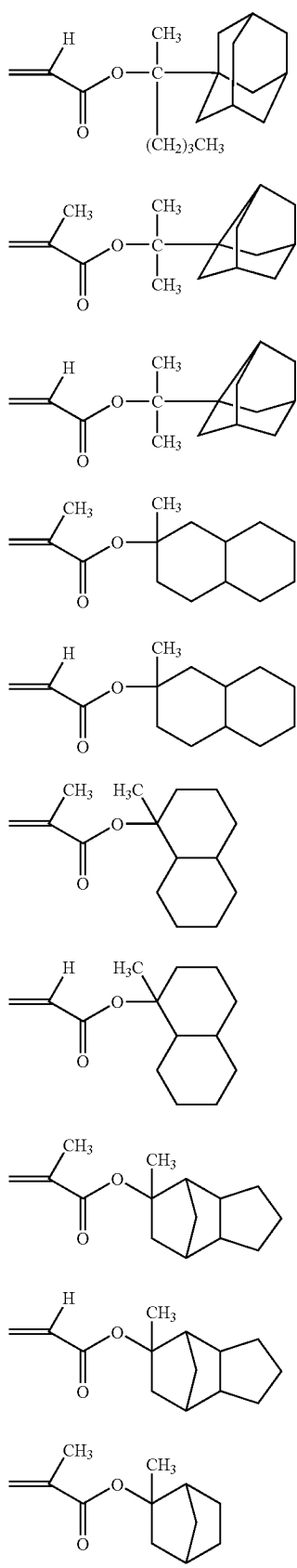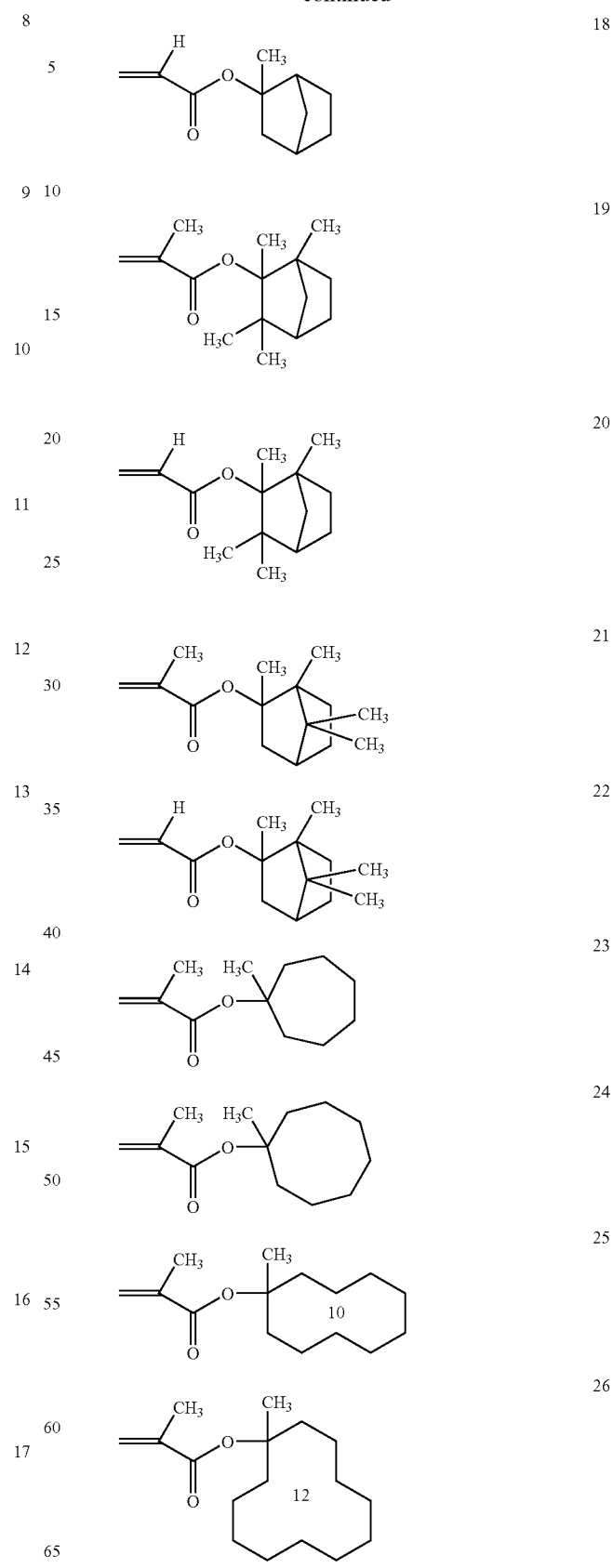

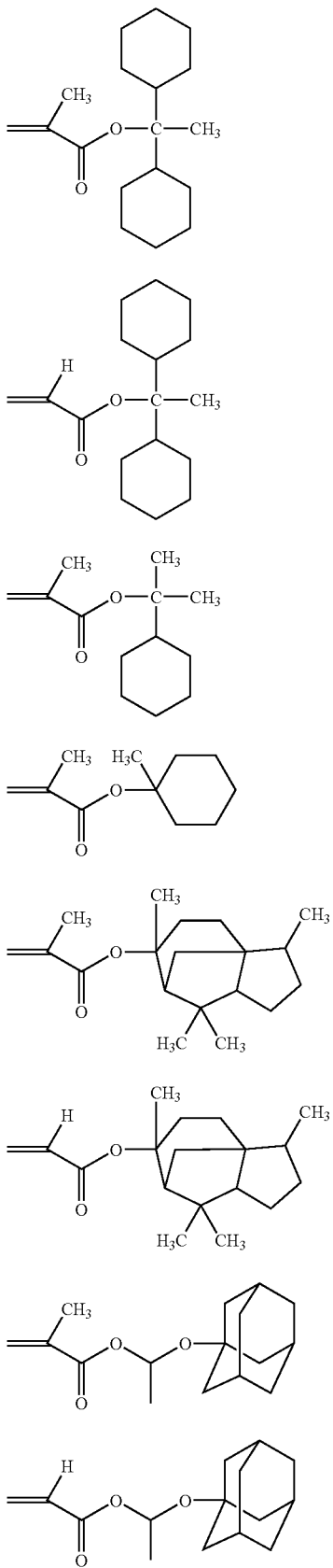
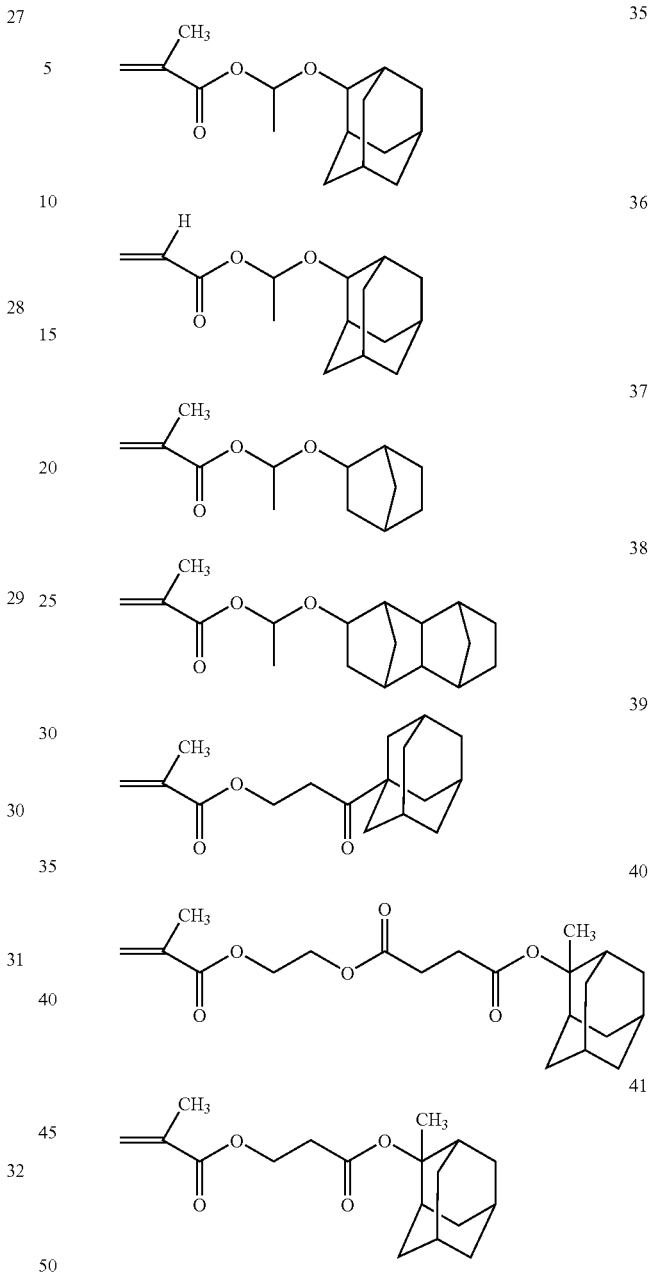

(b) Repeating Unit Containing an Alicyclic Lactone Structure

The resin (A) according to the invention contains a repeating unit (b) having an alicyclic lactone structure. By the incorporation of the repeating unit (b), improvement in performance for preventing pattern collapse and effect of restraining SEM shrinkage (shrinkage of pattern size when observed by a scanning electron microscope) are expected.

The repeating unit having an alicyclic lactone structure includes a repeating unit having, for example, cyclohexame lactone, norbornane lactone or adamantane lactone.

For instance, the repeating unit having norbornane lactone include a (meth)acryl repeating unit having a group represented by any one of formulae (a-1) to (a-3) shown below. The repeating unit having cyclohexame lactone include a (meth)acryl repeating unit having a group represented by any one of formulae (a-4) and (a-5) shown below. The repeating unit having adamantane lactone include a (meth) acryl repeating unit having a group represented by formula (VI) shown below.

Particularly, the (meth)acryl repeating unit having a group represented by any one of formulae (a-1) to (a-3) is preferred.

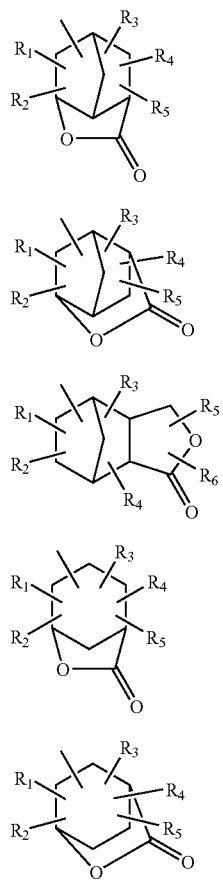

In formulae (a-1) to (a-5), $R_1$ to $R_6$ each independently represent a hydrogen atom, an alkyl group, a cycloalkyl group, an alkenyl group or —COOR$_a$ (wherein R$_a$ represents an alkyl group) Two of $R_1$ to $R_6$ may be combined with each other to form a ring.

In the above formulae, the case wherein each of $R_1$ to $R_6$ represents a hydrogen atom means that the group is unsubstituted. For example, the cyclic structure represented by formula (a-1) may have at most 5 substituents (for example, an alkyl group, a cycloalkyl group, an alkenyl group or —COOR$_a$).

The alkyl group represented by any one of $R_1$ to $R_6$ and R$_a$ includes a straight chain or branched alkyl group, which may have a substituent.

The straight chain or branched alkyl group includes preferably a straight chain or branched alkyl group having from 1 to 12 carbon atoms, more preferably a straight chain or branched alkyl group having from 1 to 10 carbon atoms, and still more preferably a methyl group, an ethyl group, a propyl group, an isopropyl group, a n-butyl group, an isobutyl group, a sec-butyl group, a tert-butyl group, a pentyl group, a hexyl group, a heptyl group, an octyl group, a nonyl group and a decyl group.

The cycloalkyl group represented by any one of $R_1$ to $R_6$ includes preferably a cycloalkyl group having from 3 to 8 carbon atoms, which may have a substituent, for example, a cyclopropyl group, a cyclopentyl group, a cyclohexyl group, a cycloheptyl group or a cyclooctyl group.

The alkenyl group represented by any one of $R_1$ to $R_6$ includes preferably an alkenyl group having from 2 to 6 carbon atoms, which may have a substituent, for example, a vinyl group, a propenyl group, a butenyl group or a hexenyl group.

The ring formed by combining two of $R_1$ to $R_6$ includes a 3-membered to 8-membered ring, for example, a cyclopropane ring, a cyclobutane ring, a cyclopentane ring, a cyclohexane ring or a cyclooctane ring.

The group represented by any one of $R_1$ to $R_6$ in formulae (a-1) to (a-5) can be bonded to any one of the carbon atoms constituting the cyclic structure.

Preferred examples of the substituent for the alkyl group, cycloalkyl group or alkenyl group described above include an alkoxy group having from 1 to 4 carbon atoms, a halogen atom (e.g., a fluorine atom, a chlorine atom, a bromine atom or an iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of a repeating unit having the group represented by any one of formulae (a-1) to (a-5) include a repeating unit represented by formula (V) shown below.

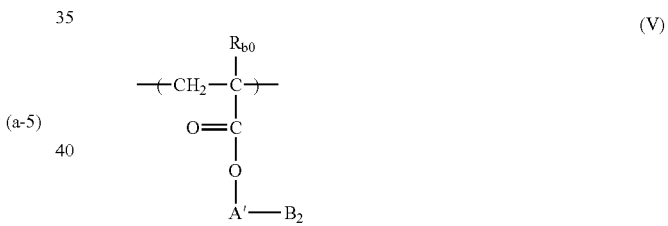

In formula (V) $R_{b0}$ represents a hydrogen atom, a halogen atom or an alkyl group having from 1 to 4 carbon atoms.

Preferred examples of the substituent for the alkyl group represented by $R_{b0}$ include those described as the preferred examples of substituent for the alkyl group represented by $R_1$ in any one of formulae (a-1) to (a-5) described above.

The halogen atom represented by $R_{b0}$ includes a fluorine atom, a chlorine atom, a bromine atom and an iodine atom. $R_{b0}$ is preferably a hydrogen atom.

A' in formula (V) represents a single bond, an ether group, an ester group, a carbonyl group, an alkylene group or a divalent group formed by combining these groups.

$B_2$ in formula (V) represents the group represented by any one of formulae (a-1) to (a-5).

Examples of the divalent group formed by combination of the groups for A' includes groups represented by the following formulae:

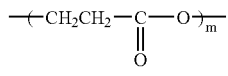

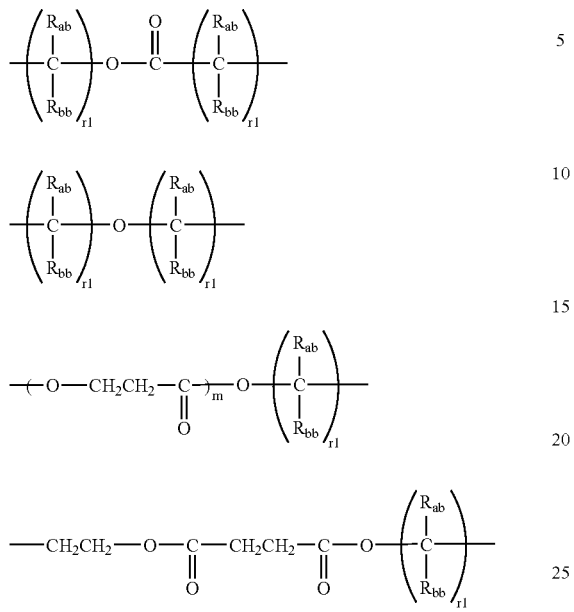

In the above-described formulae, $R_{ab}$ and $R_{bb}$, which may be the same or different, each represent a hydrogen atom, an alkyl group, a halogen atom, a hydroxy group or an alkoxy group.

The alkyl group represented by any one of $R_{ab}$ and $R_{bb}$ is preferably a lower alkyl group, for example, a methyl group, an ethyl group, a propyl group, an isopropyl group or a butyl group, and more preferably a methyl group, an ethyl group, a propyl group or an isopropyl group. The alkoxy group includes an alkoxy group having from 1 to 4 carbon atoms, for example, a methoxy group, an ethoxy group, a propoxy group or a butoxy group. The halogen atom includes, for example, a chlorine atom, a bromine atom, a fluorine atom and an iodine atom. The alkyl group or alkoxy group may have a substituent. Examples of the substituent for the alkyl group or alkoxy group include a hydroxy group, a halogen atom and an alkoxy group having from 1 to 4 carbon atoms. r1 represents an integer of from 1 to 10, and preferably an integer of from 1 to 4. m represents an integer of from 1 to 3, and preferably 1 or 2.

Specific examples of the repeating unit represented by formula (V) are set forth below, but the invention should not be construed as being limited thereto.

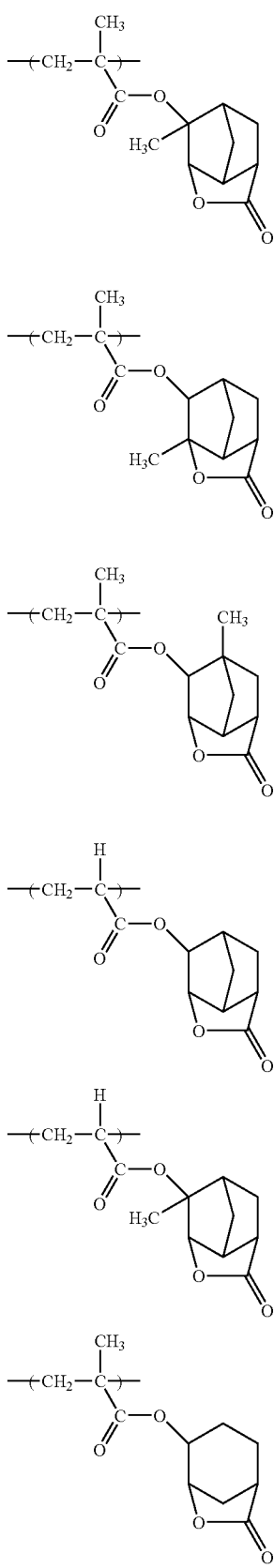

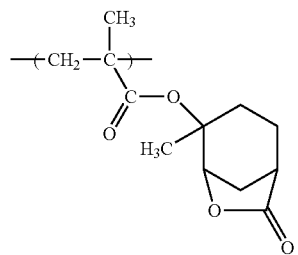
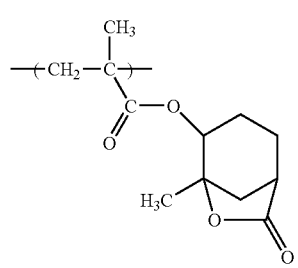
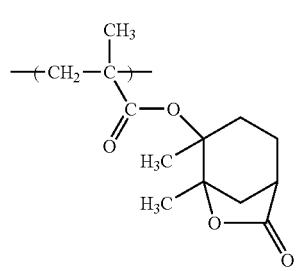
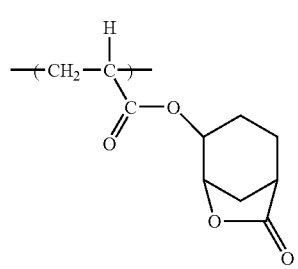
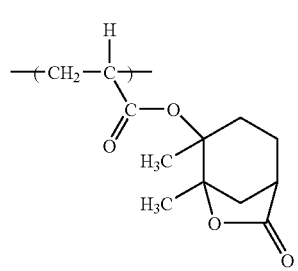
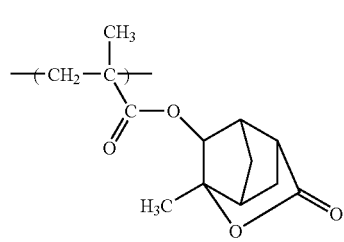
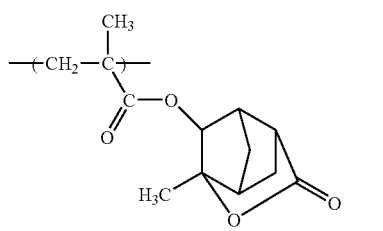
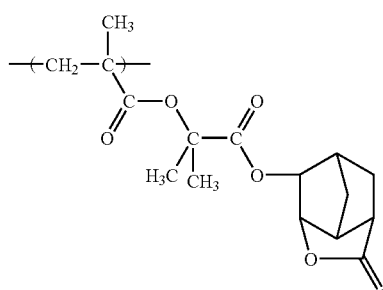
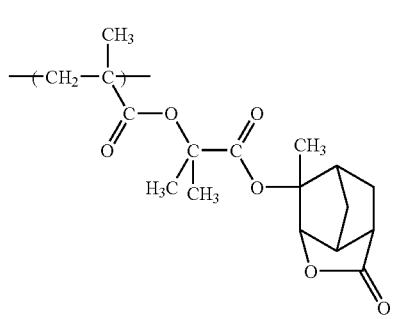
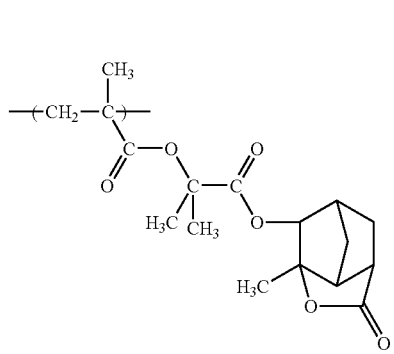
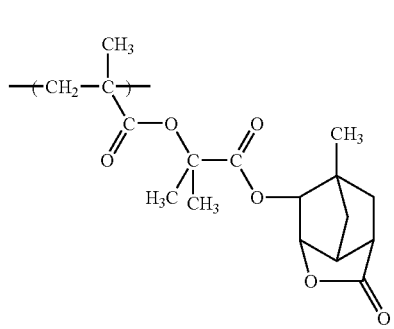

-continued
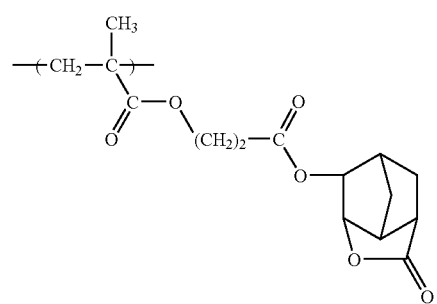
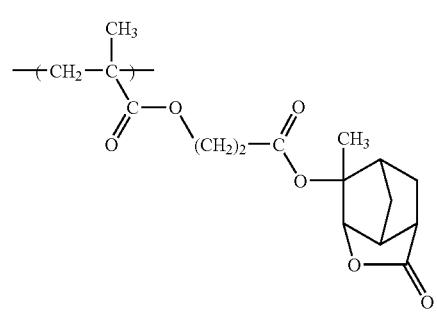
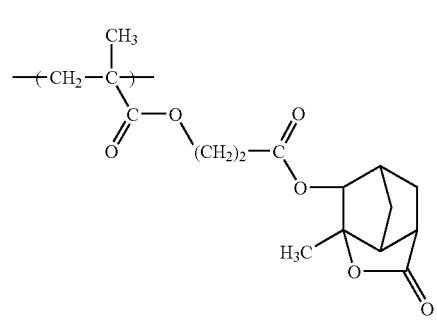
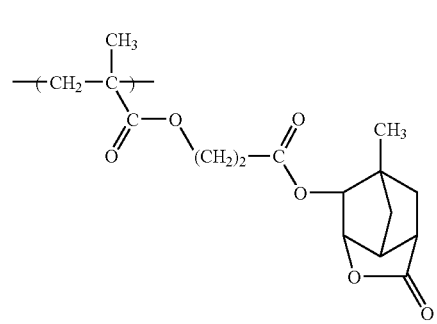
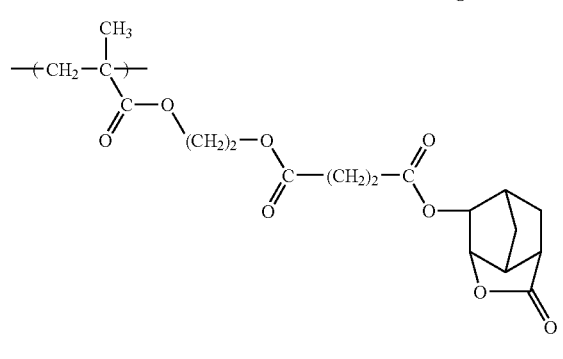
-continued
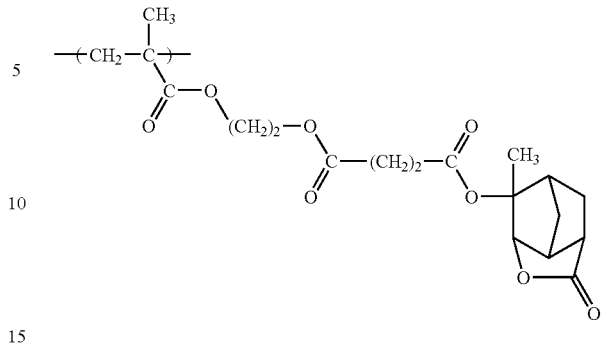
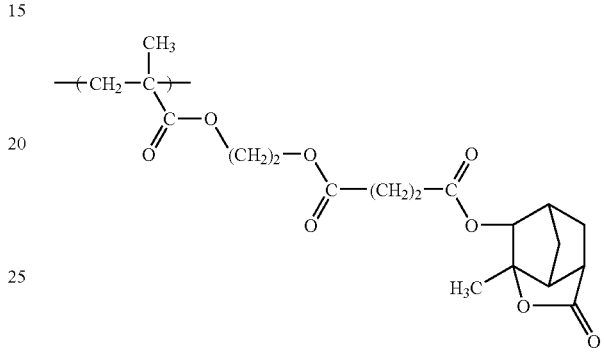
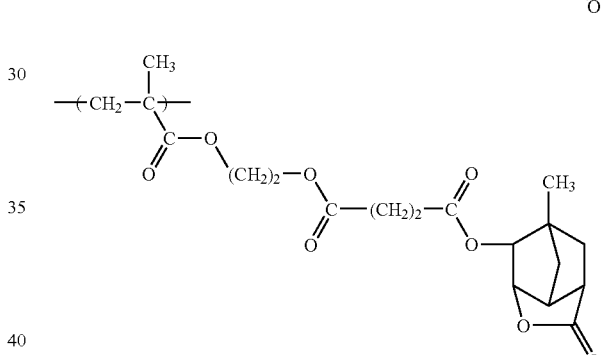
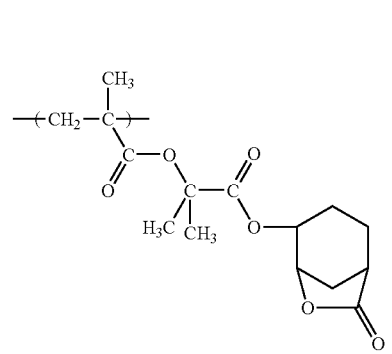
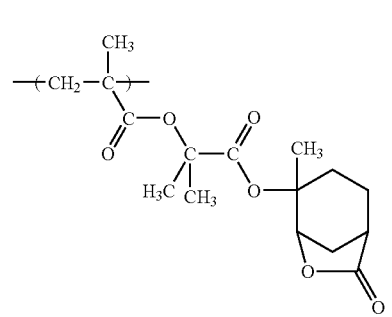

-continued
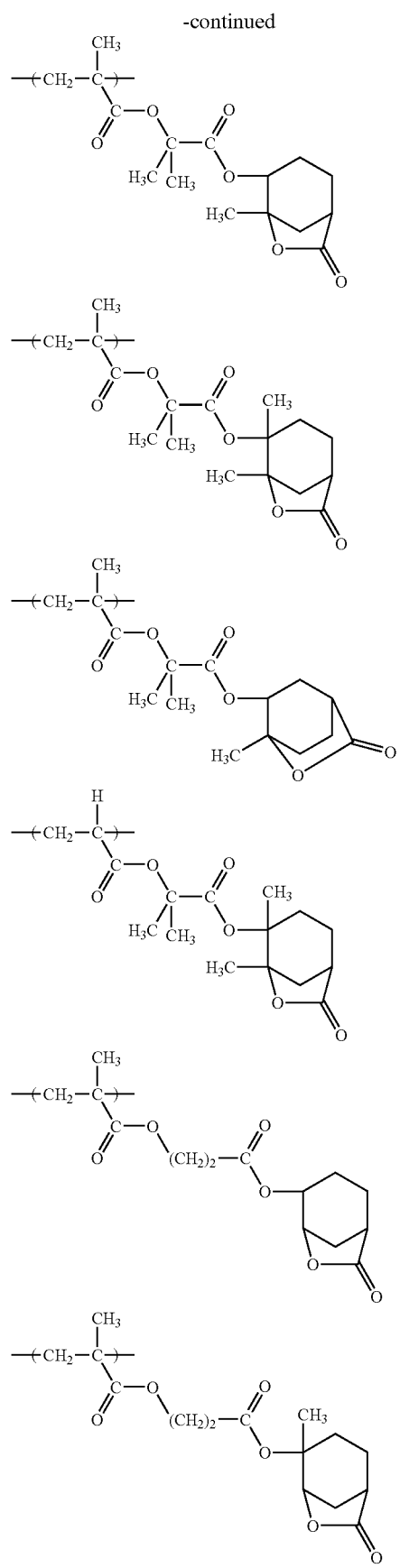
-continued
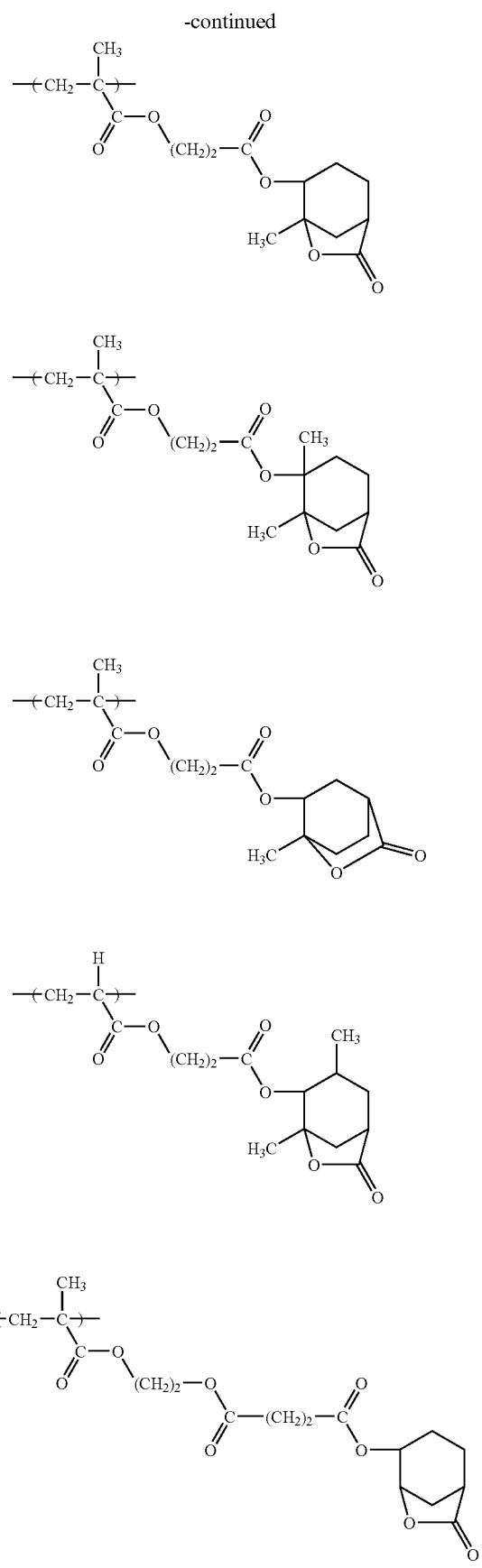

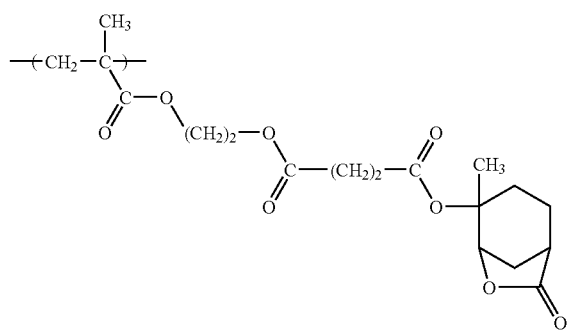
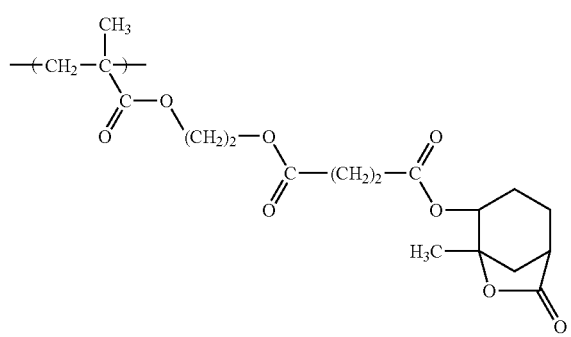
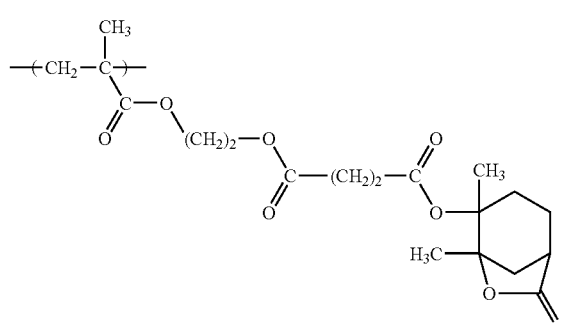
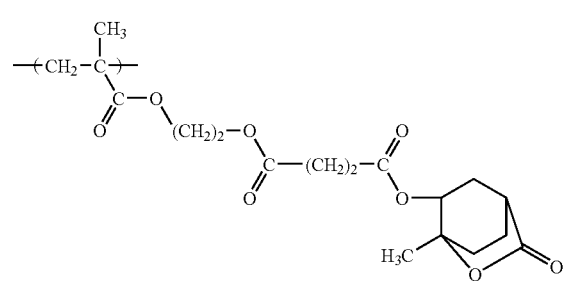
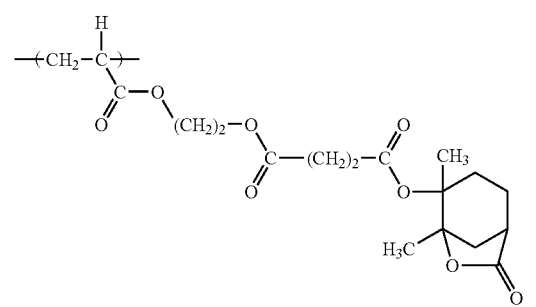

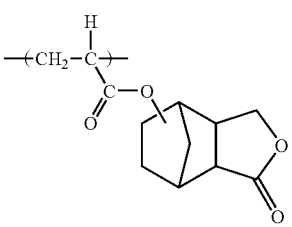
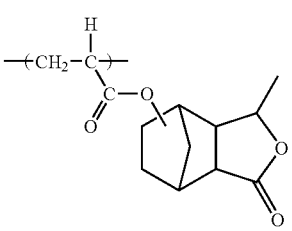
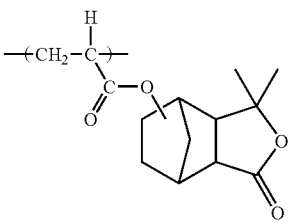
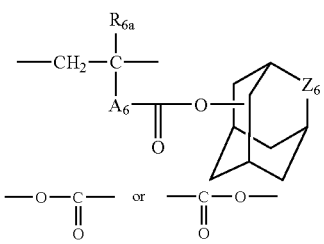

The repeating unit having adamantane lactone includes a repeating unit represented by the following formula (VI):

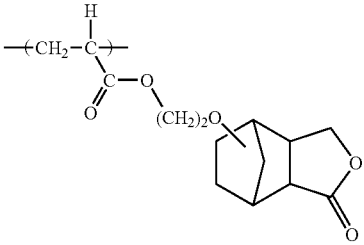

(VI)

In formula (VI), $A_6$ represents a single bond, an alkylene group, a cycloalkylene group, an ether group, a thioether group, a carbonyl group, an ester group or a combination of two or more thereof.

$R_{6a}$ represents a hydrogen atom, an alkyl group having from 1 to 4 carbon atoms, a cyano group or a halogen atom.

The alkylene group represented by $A_6$ in formula (VI) includes a group represented by the following formula:

$$—[C(Rnf)(Rng)]_r—$$

In the formula, Rnf and Rng, which may be the same or different, each represent a hydrogen atom, an alkyl group, a halogen atom, a hydroxy group or an alkoxy group.

The alkyl group includes preferably a lower alkyl group, for example, a methyl group, an ethyl group, a propyl group, an isopropyl group or a butyl group, and more preferably a methyl group, an ethyl group, a propyl group or an isopropyl group. The alkoxy group includes an alkoxy group having from 1 to 4 carbon atoms, for example, a methoxy group, an ethoxy group, a propoxy group or a butoxy group. The alkyl group or the alkoxy group may have a substituent. Examples of the substituent for the alkyl group or alkoxy group include a hydroxy group, a halogen atom and an alkoxy group. The halogen atom includes, for example, a chlorine atom, a bromine atom, a fluorine atom and an iodine atom. r represents an integer of from 1 to 10.

The cycloalkylene group represented by $A_6$ in formula (VI) includes a cycloalkylene group having from 3 to 10 carbon atoms, for example, a cyclopentylene group, a cyclohexylene group or a cyclooctylene group.

In formula (VI), the bridged alicyclic group including $Z_6$ may have a substituent. Examples of the substituent include a halogen atom, an alkoxy group (preferably an alkoxy group having from 1 to 4 carbon atoms), an alkoxycarbonyl group (preferably an alkoxycarbonyl group having from 2 to 5 carbon atoms), an acyl group (for example, a formyl group or a benzoyl group), an acyloxy group (for example, a propylcarbonyloxy or a benzoyloxy group), an alkyl group (preferably an alkyl group having from 1 to 4 carbon atoms), a carboxy group, a hydroxy group and an N-alkylsulfonylamido group (for example, —CONHSO$_2$CH$_3$). The alkyl group as the substituent may further be substituted with a hydroxy group, a halogen atom or an alkoxy group (preferably an alkoxy group having from 1 to 4 carbon atoms).

The oxygen atom of the ester group connected to $A_6$ in formula (VI) can be bonded to any one of the carbon atoms constituting the bridged alicyclic structure containing $Z_6$.

Specific examples of the repeating unit represented by formula (VI) are set forth below, but the invention should not be construed as being limited thereto.

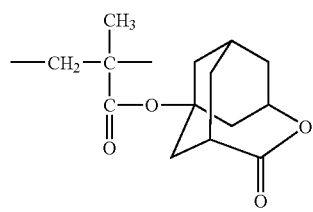

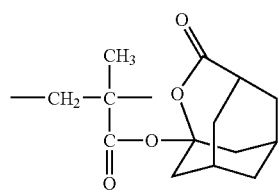

-continued

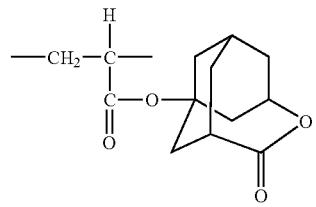

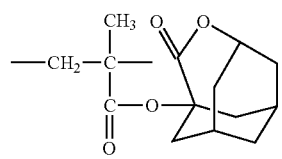

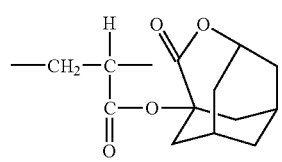

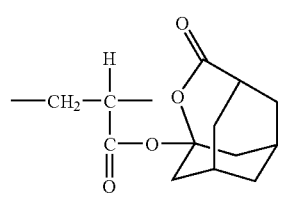

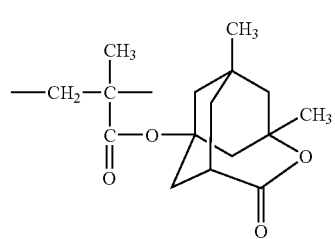

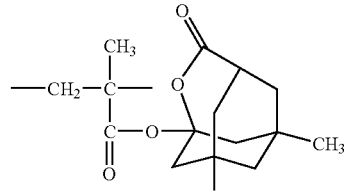

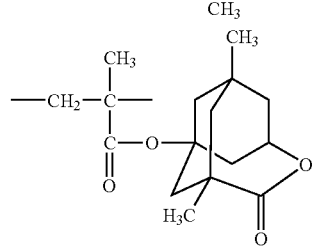

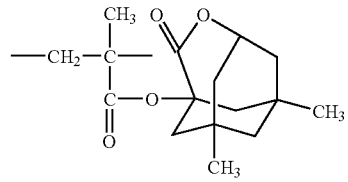

-continued

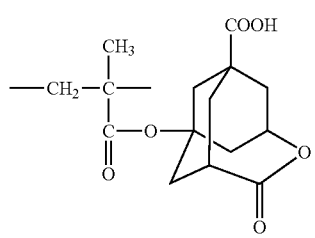

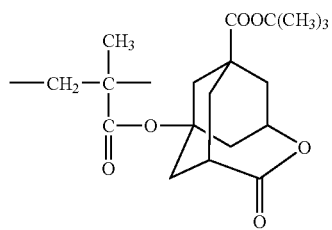

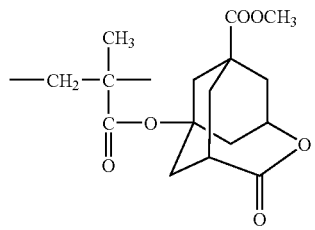

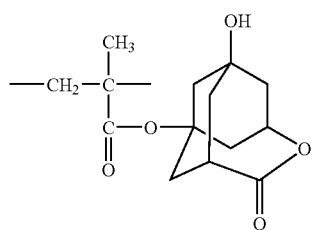

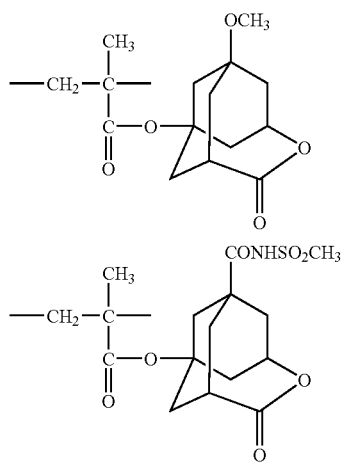

(c) Repeating Unit Containing an Alicyclic Structure Substituted with a Hydroxy Group The resin (A) according to the invention contains a repeating unit (c) having an alicyclic structure substituted with a hydroxy group. The repeating unit (c) preferably includes a repeating unit represented by the following formula (II):

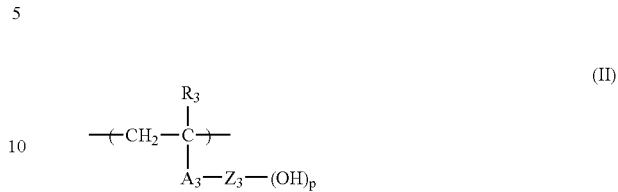

(II)

In formula (II), $R_3$ represents a hydroxy group or a methyl group. $A_3$ represents a single bond or a divalent connecting group. $Z_3$ represents a p+1 valent alicyclic hydrocarbon group. p represents an integer of from 1 to 3. Specifically, $-Z_3-(OH)_p$ represents an alicyclic hydrocarbon group substituted with p hydroxy groups.

The divalent connecting group represented by $A_3$ has the same meaning as that defined for A in formula (I), and preferred examples thereof are also the same as those described above.

The alicyclic hydrocarbon group represented by $Z_3$ has the same meaning as that represented by any one of $R_{12}$ to $R_{25}$ for ALG in formula (I), and preferred examples thereof are also the same as those described above.

The p hydroxy groups may be directly substituted on the alicyclic hydrocarbon group represented by $Z_3$ or may be substituted on a substituent of the alicyclic hydrocarbon group.

From the standpoint of obtaining a broad exposure margin in the line pattern formation by under exposure, the repeating unit represented by the following formula (II) is preferably a repeating unit represented by the following formula (IIa):

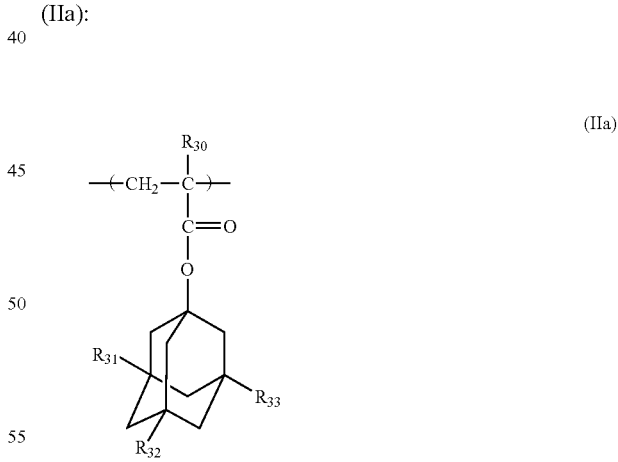

(IIa)

In formula (IIa), $R_{30}$ represents a hydroxy group or a methyl group. $R_{31}$ to $R_{33}$ each independently represent a hydrogen atom, a hydroxy group or an alkyl group, provided that at least one of $R_{31}$ to $R_{33}$ represents a hydroxy group.

Also, in view of obtaining a broad exposure margin in the hole pattern formation by under exposure, it is more preferred that two of $R_{31}$ to $R_{33}$ are hydroxy groups in the repeating unit represented by formula (IIa).

Specific examples of the repeating unit represented by formula (II) are set forth below, but the invention should not be construed as being limited thereto.
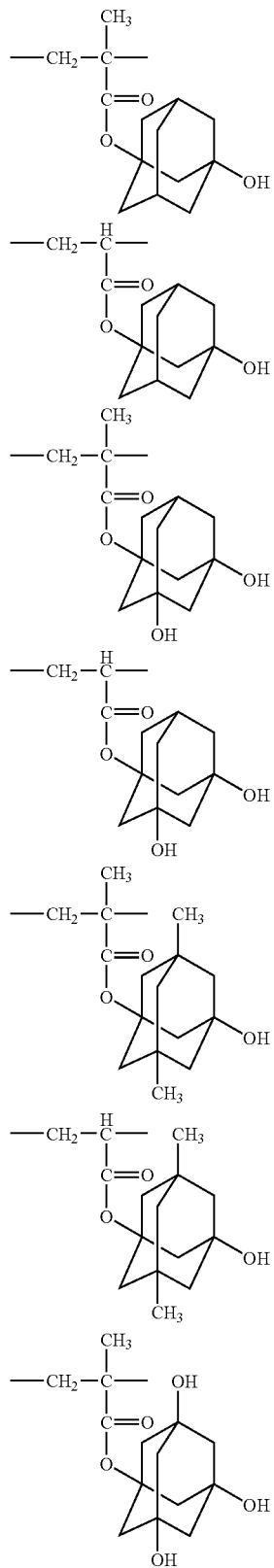
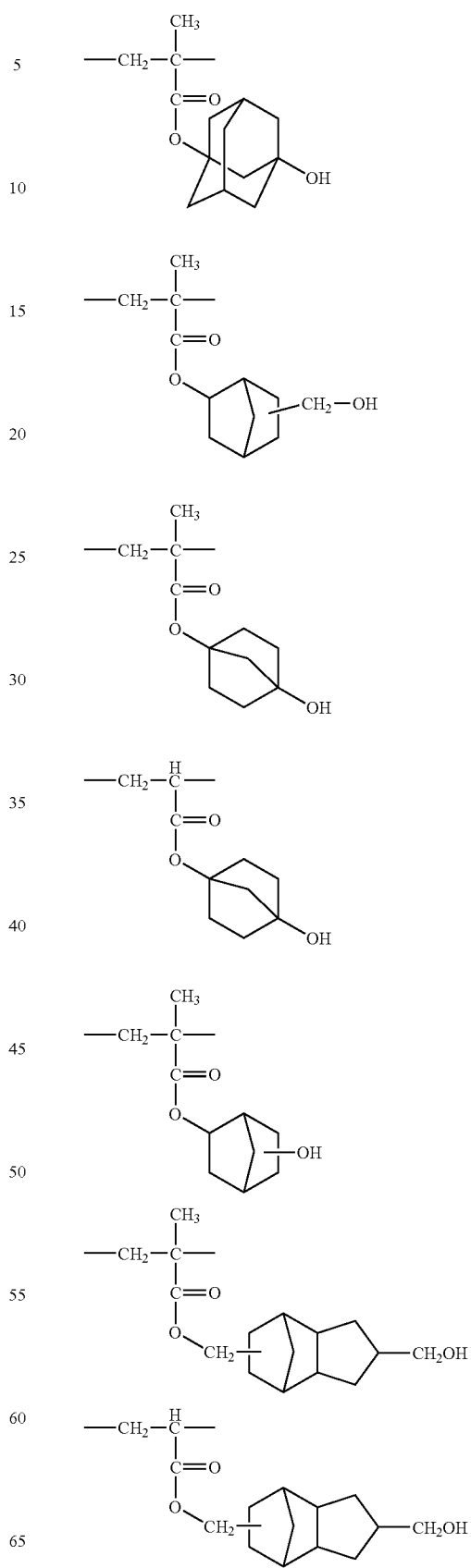

-continued

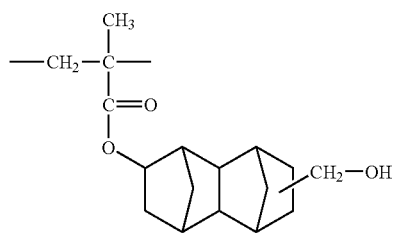
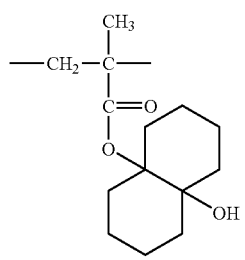
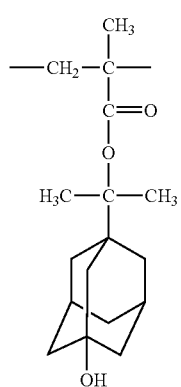
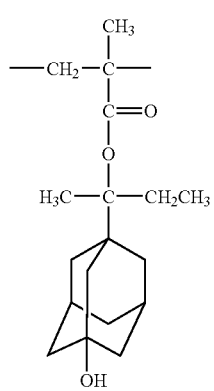
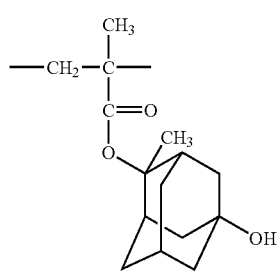

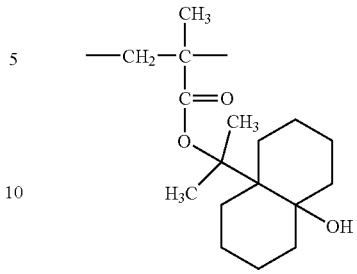

(d) Methacrylic Acid Repeating Unit

The resin (A) according to the invention contains a methacrylic acid repeating unit. The methacrylic acid repeating unit according to the invention is a repeating unit represented by the following formula:

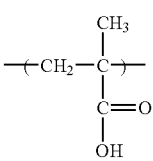

The resin (A) according to the invention may further contain a repeating unit having a lactone structure represented by the following formula (IV):

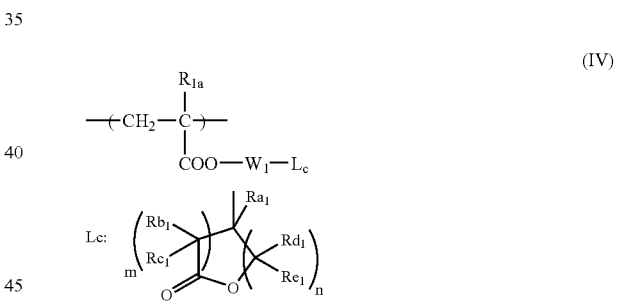

(IV)

In formula (IV), $R_{1a}$ represents a hydrogen atom or a methyl group.

$W_1$ represents a single bond, an alkylene group, an ether group, a thioether group, a carbonyl group, an ester group or a combination of two or more thereof.

$R_{a1}$, $R_{b1}$, $R_{c1}$, $R_{d1}$ and $R_{e1}$ each independently represent a hydrogen atom or an alkyl group having from 1 to 4 carbon atoms. m and n each independently represent an integer of from 0 to 3, provided that m+n is from 2 to 6.

The alkyl group having from 1 to 4 carbon atoms represented by any one of $R_{a1}$ to $R_{e1}$ includes, for example, a methyl group, an ethyl group, a propyl group, an isopropyl group, a n-butyl group, an isobutyl group, a sec-butyl group and a tert-butyl group.

The alkylene group represented by $W_1$ in formula (IV) includes a group represented by the following formula:

$$-[C(Rf)(Rg)]_{r1}-$$

In the above formula, Rf and Rg, which may be the same or different, each represent a hydrogen atom, an alkyl group, a halogen atom, a hydroxy group or an alkoxy group.

The alkyl group is preferably a lower alkyl group, for example, a methyl group, an ethyl group, a propyl group, an isopropyl group or a butyl group, more preferably a methyl group, an ethyl group, a propyl group or an isopropyl group. The alkoxy group includes an alkoxy group having from 1 to 4 carbon atoms, for example, a methoxy group, an ethoxy group, a propoxy group or a butoxy group. The halogen atom includes, for example, a chlorine atom, a bromine atom, a fluorine atom and an iodine atom. $r_1$ represents an integer of from 1 to 10.

The alkyl group or alkoxy group may have a substituent. Examples of the substituent for the alkyl group or alkoxy group includes, for example, a carboxy group, an acyloxy group, a cyano group, a halogen atom, a hydroxy group, an alkoxy group, an acetylamido group, an alkoxycarbonyl group and an acyl group.

Specific examples of the repeating unit represented by formula (IV) are set forth below, but the present invention should not be construed as being limited thereto.

(IV-1)
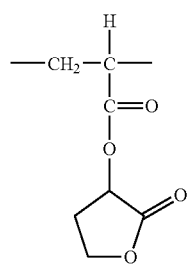

(IV-2)
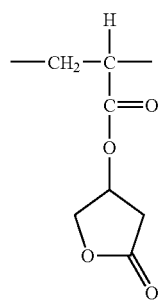

(IV-3)
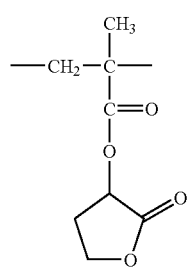

(IV-4)
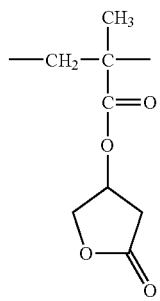

(IV-5)
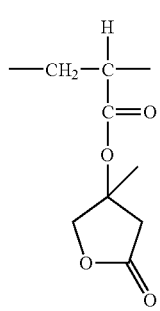

(IV-6)
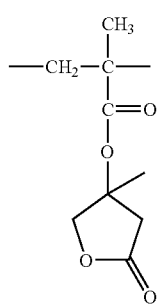

(IV-7)
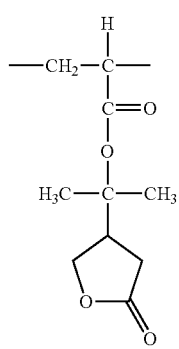

(IV-8)
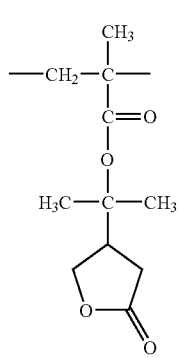

-continued
(IV-9)
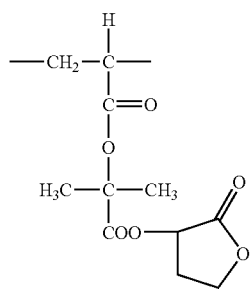
(IV-10)
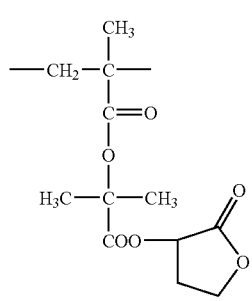
(IV-11)
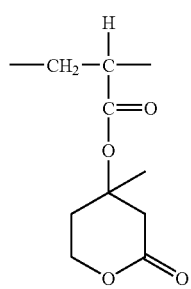
(IV-12)
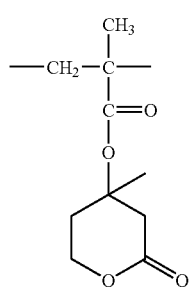
(IV-13)
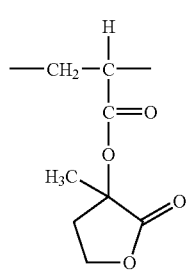
-continued
(IV-14)
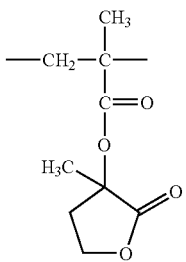
(IV-15)
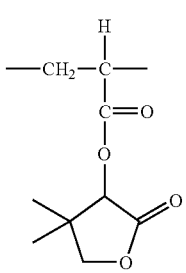
(IV-16)
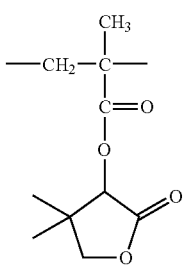
(IV-17)
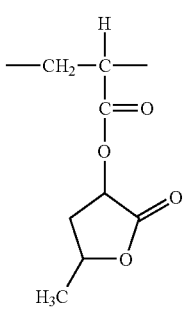
(IV-18)
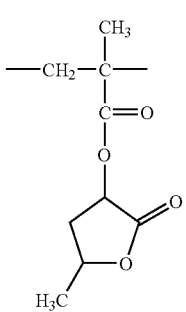

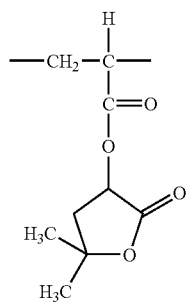 (IV-19)
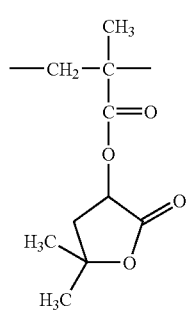 (IV-20)
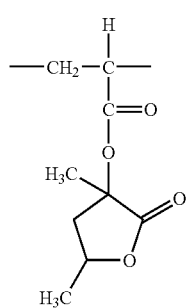 (IV-21)
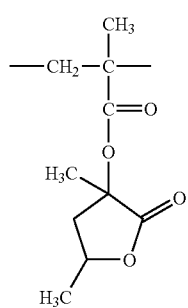 (IV-22)
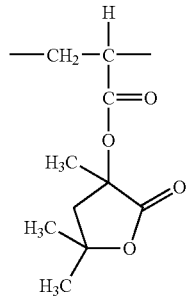 (IV-23)
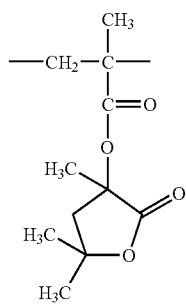 (IV-24)
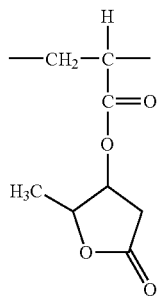 (IV-25)
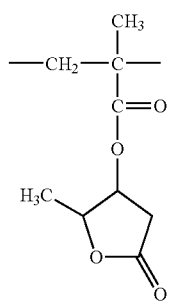 (IV-26)
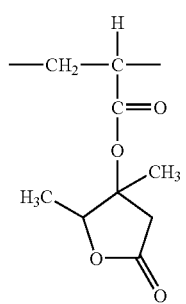 (IV-27)
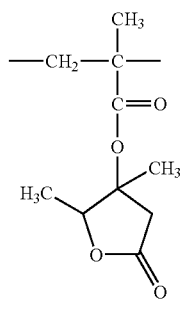 (IV-28)

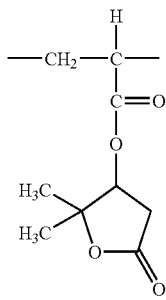
(IV-29)

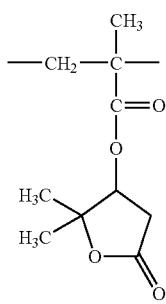
(IV-30)

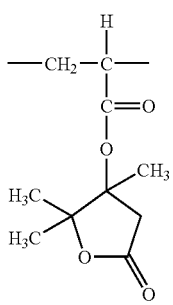
(IV-31)

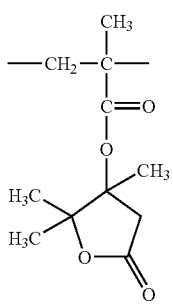
(IV-32)

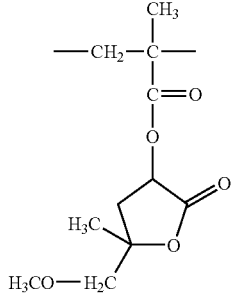
(IV-33)

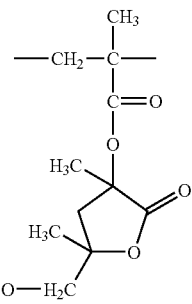
(IV-34)

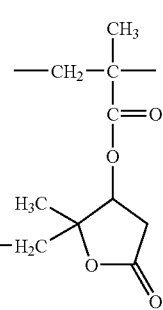
(IV-35)

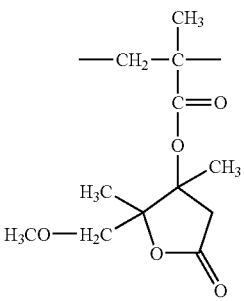
(IV-36)

Of the specific examples of the repeating unit represented by formula (IV), (IV-17) to (IV-36) are preferred in view of obtaining more improved exposure margin.

The resin (A) according to the invention may further contain a repeating unit originated from other acrylate.

The repeating unit originated from other acrylate, which may be included in the resin (A), is preferably a repeating unit of an alkyl acrylate containing an alkyl group having from 1 to 10 carbon atoms, for example, a repeating unit of methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate or tetrahydrofurfuryl acrylate.

The resin (A) according to the invention may further contain a repeating unit originated from other methacrylate.

The repeating unit originated from other methacrylate, which may be included in the resin (A), is preferably a repeating unit of an alkyl methacrylate containing an alkyl group having from 1 to 10 carbon atoms, for example, a repeating unit of methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate or tetrahydrofurfuryl methacrylate.

The resin (A) can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent capable of dissolving various monomers, e.g., propylene glycol monomethyl ether acetate, as described hereinafter, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to correct the resulting powder or solid, thereby obtaining the desired polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

In the resin (A), a content of the repeating unit (a) having an acid-decomposable group is preferably from 18 to 55% by mole, more preferably from 20 to 50% by mole, and still more preferably from 23 to 45% by mole, based on the total repeating units in the acid-decomposable resin.

A content of the repeating unit (b) having an alicyclic lactone structure is preferably from 15 to 60% by mole, more preferably from 20 to 55% by mole, and still more preferably from 25 to 50% by mole, based on the total repeating units in the acid-decomposable resin.

A content of the repeating unit (c) having an alicyclic structure substituted with a hydroxy group is preferably from 5 to 40% by mole, more preferably from 10 to 35% by mole, and still more preferably from 15 to 30% by mole, based on the total repeating units in the acid-decomposable resin.

A content of the methacrylic acid repeating unit (d) is preferably from 5 to 18% by mole, more preferably from 7 to 17% by mole, and still more preferably from 8 to 16% by mole, based on the total repeating units in the acid-decomposable resin.

The total content of the above-described four kinds of repeating units is ordinarily not less than 70% by mole, preferably from 80 to 100% by mole, and more preferably from 90 to 100% by mole, based on the total repeating units in the acid-decomposable resin.

A content of the repeating unit having a lactone structure in the side chain represented by formula (IV) is preferably from 1 to 30% by mole, more preferably from 3 to 20% by mole, and still more preferably from 5 to 10% by mole, based on the total repeating units in the acid-decomposable resin.

An amount of the resin (A) added is ordinarily from 50 to 99% by weight, and preferably from 60 to 98% by weight, based on the total solid content of the positive resist composition.

According to the invention, an acid value of the resin of component (A) is preferably from 0.2 to 0.9 meq/g, more preferably from 0.3 to 0.8 meq/g. The acid value can be determined by titration of a solution of the resin with an alkali solution. In the titration procedure, a point of neutralization is ordinarily obtained using a titration indicator, for example, phenolphthalein or potentiometry.

[2] Compound that Generates an Acid Upon Irradiation of an Actinic Ray or Radiation (Component (B))

The positive resist composition of the invention contains a compound that generates an acid upon irradiation of an actinic ray or radiation (photo-acid generator, Component (B)).

The photo-acid generator can be appropriately selected from photoinitiators for photo-cationic polymerization, photoinitiators for photo-radical polymerization, photo-achromatic agents for dyes, photo-discoloring agents, known compounds generating an acid upon irradiation of an actinic ray or radiation, for example, light used in a microresist or the like preferably having a wavelength of from 150 nm to 250 nm (specifically, a KrF excimer laser beam (248 nm), an ArF excimer laser beam (193 nm), an $F_2$ excimer laser beam (157 nm)), an X ray, an electron beam or the like, and mixtures of these compounds.

Examples of the photo-acid generators include a diazonium salt, a phosphonium salt, a sulfonium salt, an iodonium salt, an imidosulfonate, an oximesulfonate, a diazodisulfone, a disulfones and an o-nitrobenzylsulfonate.

Of the compounds, a sulfonium salt is particularly preferred, and a triaryl sulfonium salt, a phenacyl sulfonium salt and a sulfonium salt having 2-oxoalkyl group are most preferred.

Also, polymer compounds in which a group or compound generating an acid upon irradiation of an actinic ray or radiation is introduced into the main chain or side chain thereof, for example, compounds as described, for example, in U.S. Pat. No. 3,849,137, West German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds generating an acid with light as described, for example, in U.S. Pat. No. 3,779,778 and European Patent 126,712 can be used.

As particularly preferred compounds of the compounds that are decomposed upon irradiation of an actinic ray or radiation to generate an acid, compounds represented by formulae (ZI), (ZII) and (ZIII) shown below are exemplified.

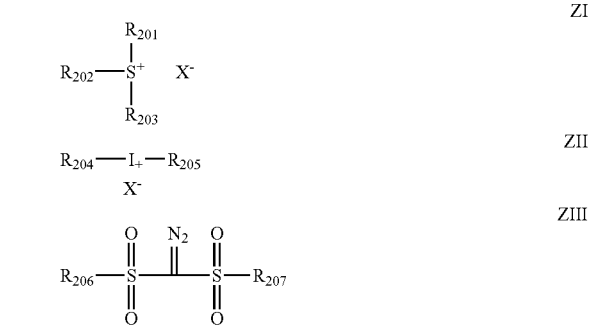

In formula (ZI), $R_{201}$, $R_{202}$ and $R_{203}$ each independently represent an organic group.

A number of carbon atoms included in the organic group represented by any one of $R_{201}$, $R_{202}$ and $R_{203}$ is ordinarily from 1 to 30, and preferably from 1 to 20.

Also, two of $R_{201}$, $R_{202}$ and $R_{203}$ may be combined with each other to from a ring structure, and the ring structure may include an oxygen atom, a sulfur atom, an ester bond, an amido bond or a carbonyl group.

A group formed by combining two of $R_{201}$, $R_{202}$ and $R_{203}$ include an alkylene group (for example, a butylene group or a pentylene group).

$X^-$ represents a non-nucleophilic anion.

The non-nucleophilic anion represented by $X^-$ includes, for example, a sulfonic acid anion, a carboxylic acid anion, a sulfonylimido anion, a bis(alkylsulfonyl)imido anion and a tris(alkylsulfonyl)methyl anion.

The non-nucleophilic anion means an anion having an extremely low ability for causing a nucleophilic reaction and an anion capable of controlling decomposition with the lapse of time by an intramolecular nucleophilic reaction. By means of the non-nucleophilic anion, preservation stability of the resist composition is improved.

Examples of the sulfonic acid anion include an alkylsulfonic acid anion, an arylsulfonic acid anion and camphorsulfonic acid anion.

Examples of the carboxylic acid anion include an alkylcarboxylic acid anion, an arylcarboxylic acid anion and an aralkylcarboxylic acid anion.

The alkyl moiety in the alkylsulfonic acid anion may be a chain alkyl group or a cycloalkyl group and preferably includes an alkyl group having from 1 to 30 carbon atoms and a cycoalkyl group having from 3 to 30 carbon atoms, for example, a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group or a bornyl group.

The aryl group in the arylsulfonic acid anion is preferably an aryl group having from 6 to 14 carbon atoms, for example, a phenyl group, a tolyl group or a naphthyl group.

The alkyl group, cycloalkyl group and aryl group in the alkylsulfonic acid anion and arylsulfonic acid anion may have a substituent.

Examples of the substituent include a nitro group, a halogen atom (for example, a fluorine atom, a chlorine atom, a bromine atom or an iodine atom), a carboxy group, a hydroxy group, an amino group, a cyano group, an alkyl group (preferably having from 1 to 5 carbon atoms), an alkoxy group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), an alkoxycarbonyloxy group (preferably having from 2 to 7 carbon atoms) and an alkylthio group (preferably having from 1 to 5 carbon atoms). The aryl group and ring structure included in each of these groups may further have a substituent, for example, an alkyl group (preferably having from 1 to 15 carbon atoms).

The alkyl moiety in the alkylcarboxylic acid anion is same as the alkyl moiety in the alkylsulfonic acid anion including the alkyl group and cycloalkyl group.

The aryl group in the arylcarboxylic acid anion is same as the alkyl moiety in the arylsulfonic acid anion.

The aralkyl group in the aralkylcarboxylic acid anion is preferably an aralkyl group having from 7 to 12 carbon atoms, for example, a benzyl group, a phenethyl group, a naphthylmethyl group or a naphthylethyl group.

The alkyl group, cycloalkyl group, aryl group and aralkyl group in the alkylcarboxylic acid anion, arylcarboxylic acid anion and aralkylcarboxylic acid anion may have a substituent. Examples of the substituent include those described for the arylsulfonic acid anion, for example, a halogen atom, an alkyl group, a cycloalkyl group, an alkoxy group or an alkylthio group.

Examples of the sulfonylimido anion include saccharin anion.

The alkyl group in the bis(alkylsulfonyl)imido anion or tris(alkylsulfonyl)methyl anion preferably includes an alkyl group having from 1 to 5 carbon atoms, for example, a methyl group, an ethyl group, a propyl group, an isopropyl group, a n-butyl group, an isobutyl group, a sec-butyl group, a pentyl group or a neopentyl group. The alkyl group may have a substituent and examples of the substituent include a halogen atom, an alkyl group substituted with a halogen atom, an alkoxy group and an alkylthio group. Of the substituents, an alkyl group substituted with a fluorine atom is preferred.

Other examples of the non-nucleophilic anion include phosphorus fluoride, boron fluoride and antimony fluoride.

Of the non-nucleophilic anions represented by $X^-$, an alkanesulfonic acid anion wherein the α-position of the sulfonic acid is substituted with a fluorine atom, an arylsulfonic acid anion substituted with a fluorine atom or a group having a fluorine atom, a bis(alkylsulfonyl)imido anion wherein the alkyl group is substituted with a fluorine atom and a tris(alkylsulfonyl)methyl anion wherein the alkyl group is substituted with a fluorine atom are preferred. As the non-nucleophilic anions for $X^-$, a perfluoroalkanesulfonic anion having from 4 to 8 carbon atoms and a benzenesulfonic acid anion having a fluorine atom are particularly preferred and, nonafluorobutanesulfonic acid anion, perfluorooctanesulfonic acid anion, a pentafluorobenzenesulfonic acid anion and a 3,5-bis(trifluoromethyl)benzenesulfonic acid anion are most preferred.

Specific examples of the organic group represented by any one of $R_{201}$, $R_{202}$ and $R_{203}$ include the corresponding groups in Compounds (Z1-1), (Z1-2) and (Z1-3) described below.

Compounds having two or more of the structures represented by formula (ZI) may also be used. For example, a compound having a structure in which at least one of $R_{201}$, $R_{202}$ and $R_{203}$ in one compound represented by formula (ZI) is connected to at least one of $R_{201}$, $R_{202}$ and $R_{203}$ in another compound represented by formula (ZI).

As more preferable compounds of the compounds represented by formula (ZI), Compounds (Z1-1), (Z1-2) and (Z1-3) described below are exemplified.

Compound (Z1-1) is an arylsulfonium compound wherein at least one of $R_{201}$, $R_{202}$ and $R_{203}$ in formula (ZI) is an aryl group, that is, a compound including an arylsulfonium as a cation.

In the arylsulfonium compound, all of $R_{201}$, $R_{202}$ and $R_{203}$ may be aryl groups, or a part of $R_{201}$, $R_{202}$ and $R_{203}$ may be an aryl group and the remainder may be an alkyl group or a cycloalkyl group.

Examples of the arylsulfonium compound include triarylsulfonium compounds, diarylalkylsulfonium compounds, aryldialkylsulfonium compounds, diarylcycloalkylsulfonium compounds and aryldicycloalkylsulfonium compounds.

As the aryl group in the arylsulfonium compound, a phenyl group or a naphthyl group is preferable and a phenyl group is more preferable. When the arylsulfonium compound includes two or more aryl groups, the two or more aryl groups may be the same or different from each other.

The alkyl group or cycloalkyl group, which is included in the arylsulfonium compound, if desired, is preferably a straight chain or branched alkyl group having from 1 to 15 carbon atoms or a cycloalkyl group having from 3 to 15 carbon atoms, and includes a methyl group, an ethyl group, a propyl group, a n-butyl group, a sec-butyl group, a tert-butyl group, a cyclopropyl group, a cyclobutyl group and a cyclohexyl group.

The aryl group, alkyl group or cycloalkyl group represented by any one of $R_{201}$, $R_{202}$ and $R_{203}$ may have as a substituent, an alkyl group (for example, an alkyl group having from 1 to 15 carbon atoms), a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferred examples of the substituent include a straight chain or branched alkyl group having from 1 to 12 carbon atoms, a cycloalkyl group having from 3 to 12 carbon atoms and a straight-chain, branched or cyclic alkoxy group having from 1 to 12 carbon atoms. An alkyl group having from 1 to 4 carbon atoms and an alkoxy group having from 1 to 4 carbon atoms are most preferred. The substituent may be substituted on any one of $R_{201}$, $R_{202}$ and $R_{203}$ or the substituents may be substituted on all of $R_{201}$, $R_{202}$ and $R_{203}$. When $R_{201}$, $R_{202}$ or $R_{203}$ represents an aryl group, the substituent is preferably substituted on the p-position of the aryl group.

Now, Compound (Z1-2) is described below.

Compound (Z1-2) is a compound wherein $R_{201}$, $R_{202}$ and $R_{203}$ in formula (ZI) each independently represent an organic group including no aromatic ring. The term "aromatic ring" used herein includes an aromatic ring containing a hetero atom also.

The organic group including no aromatic ring represented by any one of $R_{201}$, $R_{202}$ and $R_{203}$ has ordinarily from 1 to 30 carbon atoms, and preferably from 1 to 20 carbon atoms.

$R_{201}$, $R_{202}$ and $R_{203}$ each independently preferably represent an alkyl group, a cycloalkyl group, an allyl group or a vinyl group, more preferably a straight chain or branched 2-oxoalkyl group, a 2-oxocycloalkyl group or an alkoxycarbonylmethyl group, and most preferably a straight chain or branched 2-oxoalkyl group.

The alkyl group or cycloalkyl group represented by any one of $R_{201}$, $R_{202}$ and $R_{203}$ preferably includes a straight-chain or branched alkyl group having from 1 to 10 carbon atoms (for example, a methyl group, an ethyl group, a propyl group, a butyl group or a pentyl group) and a cycloalkyl group having from 3 to 10 carbon atoms (for example, a cyclopentyl group, a cyclohexyl group or a norbornyl group). More preferred examples of the alkyl group include a 2-oxoalkyl group and an alkoxycarbonylmethyl group. More preferred examples of the cycloalkyl group include a 2-oxocycloalkyl group.

The 2-oxoalkyl group may be any one of straight-chain and branched 2-oxoalkyl groups, and preferably includes a 2-oxoalkyl group in which >C=O is present at the 2-position of each of the above-described alkyl groups.

The 2-oxocycloalkyl group preferably includes a 2-oxocycloalkyl group in which >C=O is present at the 2-position of each of the above-described cycloalkyl groups.

The alkoxy group of the alkoxycarbonylmethyl group includes preferably an alkoxy group having from 1 to 5 carbon atoms (for example, a methoxy group, an ethoxy group, a propoxy group, a butoxy group or a pentoxy group).

The group represented by any one of $R_{201}$, $R_{202}$ and $R_{203}$ may further be substituted with a halogen atom, an alkoxy group (for example, an alkoxy group having from 1 to 5 carbon atoms), a hydroxy group, a cyano group or a nitro group.

Two of $R_{201}$, $R_{202}$ and $R_{203}$ may be combined with each other to from a ring structure, and the ring structure may include an oxygen atom, a sulfur atom, an ester bond, an amido bond or a carbonyl group. A group formed by connecting with two of $R_{201}$, $R_{202}$ and $R_{203}$ includes an alkylene group (for example, a butylene group or a pentylene group).

Compound (Z1-3) is a compound represented by formula (Z1-3) shown below, and a compound containing a phenacylsulfonium salt structure.

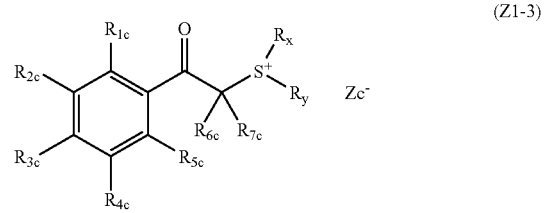

(Z1-3)

wherein $R_{1c}$ to $R_{5c}$ each independently represent a hydrogen atom, an alkyl group, a cycloalkyl group, an alkoxy group or a halogen atom.

$R_{6c}$ and $R_{7c}$ each independently represent a hydrogen atom, an alkyl group or a cycloalkyl group.

$R_x$ and $R_y$ each independently represent an alkyl group, a cycloalkyl group, an allyl group or a vinyl group.

At least any two of $R_{1c}$ to $R_{5c}$, or $R_x$ and $R_y$ may be combined with each other to form a cyclic structure, and the cyclic structure may include an oxygen atom, a sulfur atom, an ester bond or an amido bond.

$Zc^-$ represents a non-nucleophilic anion, and includes the non-nucleophilic anions same as those defined for $X^-$ in formula (ZI).

The alkyl group represented by any one of $R_{1c}$ to $R_{7c}$ may be any one of a straight chain or branched alkyl group, and includes, for example, an alkyl group having from 1 to 20 carbon atoms. Preferred examples thereof include a straight chain or branched alkyl group having from 1 to 12 carbon atoms (for example, a methyl group, an ethyl group, a straight chain or branched propyl group, a straight chain or branched butyl group or a straight chain or branched pentyl group).

The cycloalkyl group includes a cyclic alkyl group having from 3 to 8 carbon atoms (for example, a cyclopentyl group or a cyclohexyl group).

The alkoxy group represented by any one of $R_{1c}$ to $R_{5c}$ may be any one of a straight chain, branched or cyclic alkoxy group, and includes, for example, an alkoxy group having from 1 to 10 carbon atoms. Preferred examples thereof include a straight chain or branched alkoxy group having from 1 to 5 carbon atoms (for example, a methoxy group, an ethoxy group, a straight chain or branched propoxy group, a straight chain or branched butoxy group or a straight chain or branched pentoxy group) and a cyclic alkoxy group having from 3 to 8 carbon atoms (for example, a cyclopentyloxy group or a cyclohexyloxy group).

Preferably, any one of $R_{1c}$ to $R_{5c}$ represents a straight chain or branched alkyl group, a cycloalkyl group or a straight chain, branched or cyclic alkoxy group, and more preferably, the total number of carbon atoms included in $R_{1c}$ to $R_{5c}$ is from 2 to 15. This makes it possible to improve solubility in a solvent, whereby the generation of particles during storage of the resist composition is restrained.

The alkyl group and cycloalkyl group for any one of $R_x$ and $R_y$ is same as the alkyl group or cycloalkyl group for any one of $R_{1c}$ to $R_{7c}$, and preferably includes a 2-oxoalkyl group, a 2-oxocycloalkyl group and an alkoxycarbonylmethyl group.

Examples of the 2-oxoalkyl group or 2-oxocycloalkyl group include a 2-oxoalkyl group or 2-oxocycloalkyl group having >C=O at the 2-position of the alkyl group or cycloalkyl group for any one of $R_{1c}$ to $R_{7c}$.

The alkoxy group of the alkoxycarbonylmethyl group is same as the alkoxy group for any one of $R_{1c}$ to $R_{5c}$.

Examples of the group formed by connecting with $R_x$ and $R_y$ include a butylene group and a pentylene group.

$R_x$ and $R_y$ preferably represent an alkyl group or a cycloalkyl group having not less than 4 carbon atoms, more preferably an alkyl group or a cycloalkyl group having not less than 6 carbon atoms, and still more preferably an alkyl group or a cycloalkyl group having not less than 8 carbon atoms.

In formulae (ZII) or (ZIII), $R_{204}$ or $R_{207}$ each independently represent an aryl group, an alkyl group, or a cycloalkyl group.

The aryl group represented by any one of $R_{204}$ or $R_{207}$ is preferably a phenyl group or a naphthyl group, and more preferably a phenyl group.

The alkyl group or cycloalkyl group represented by any one of $R_{204}$ or $R_{207}$ preferably includes a straight chain or branched alkyl group having from 1 to 10 carbon atoms (for example, a methyl group, an ethyl group, a propyl group, a butyl group or a pentyl group) and a cyclic alkyl group having from 3 to 10 carbon atoms (for example, a cyclopentyl group, a cyclohexyl group or a norbornyl group).

The substituent, which may be present on the group represented by any one of $R_{204}$ or $R_{207}$, includes an alkyl group (for example, an alkyl group having from 1 to 15 carbon atoms), a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group or a phenylthio group.

$X^-$ represents a non-nucleophilic anion, and includes those same as the non-nucleophilic anion represented by $X^-$ in formula (ZI).

Particularly preferred examples of the photo-acid generator are set forth below.

(z1)
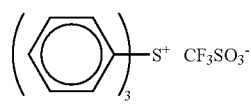

(z2)
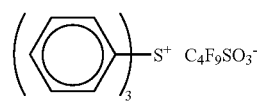

(z3)
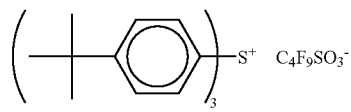

(z4)
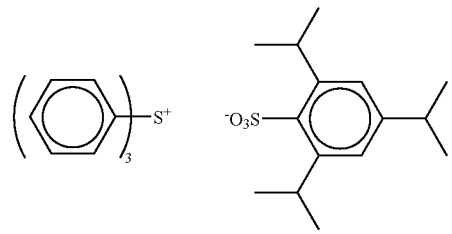

(z5)
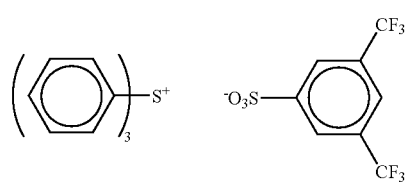

(z6)
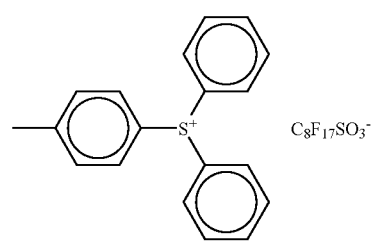

(z7)
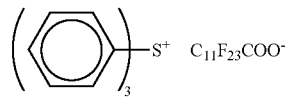

(z8)

-continued
(z9)
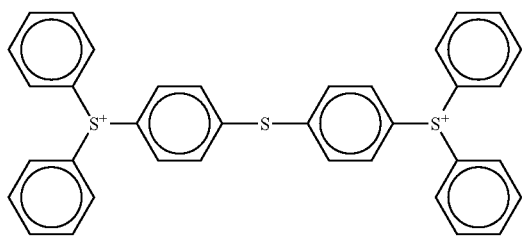 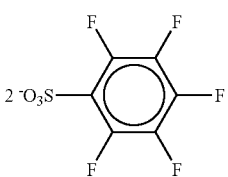
(z10) (z11)
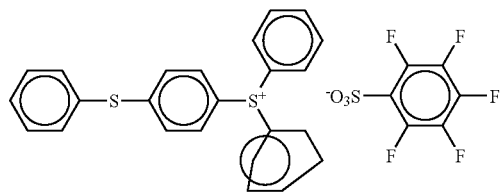 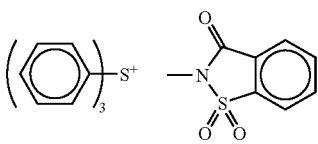
(z12) (z13)
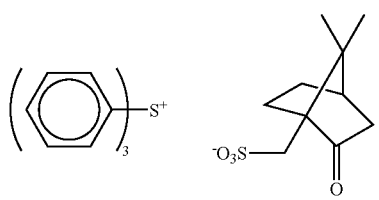 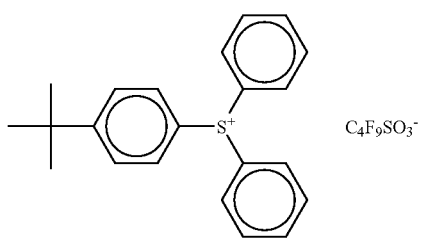
(z14) (z15)
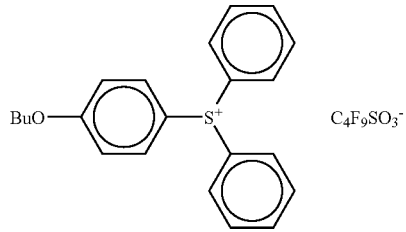 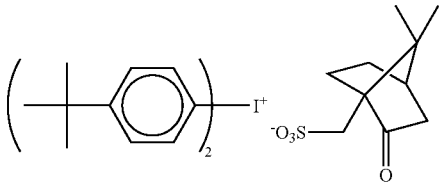
(z16) (z17)
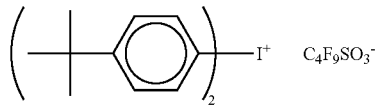 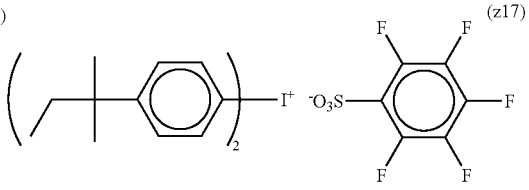
(z18) (z19)
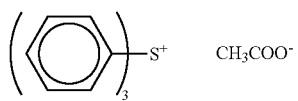 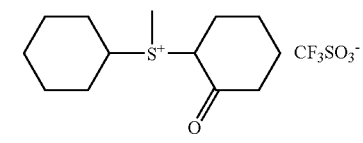
(z20)
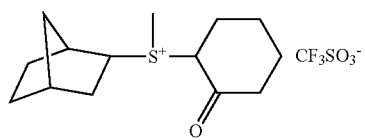

-continued
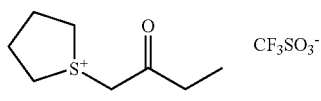 (z21)
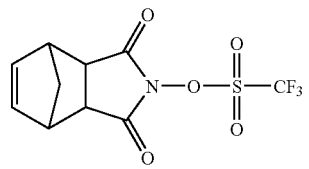 (z22)
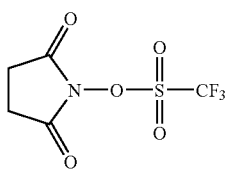 (z23)
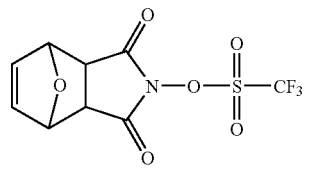 (z24)
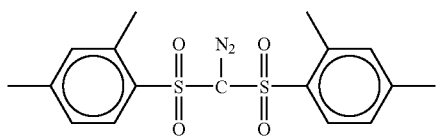 (z25)
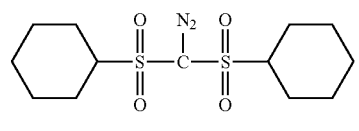 (z26)
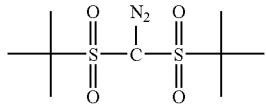 (z27)
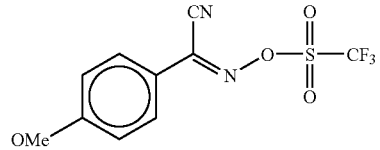 (z28)
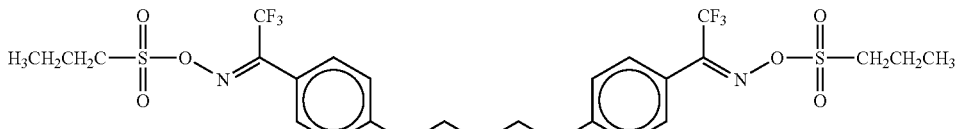 (z29)
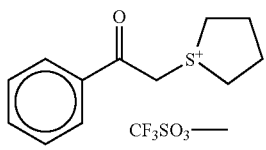 (z30)
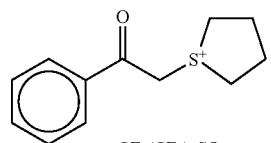 (z31)
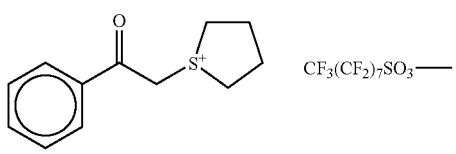 (z32)
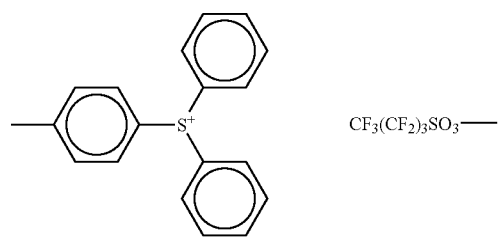 (z33)

-continued
(z34) 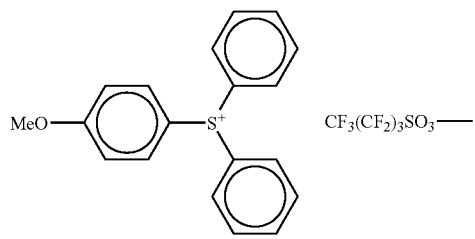
(z35) 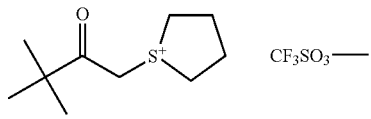
(z36) 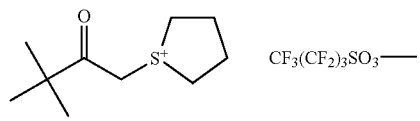
(z37) 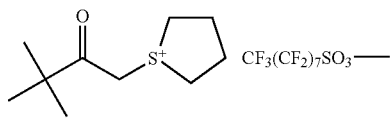
(z38) 
(z39) 
(z40) 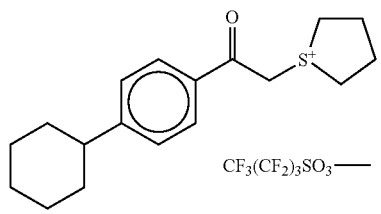
(z41) 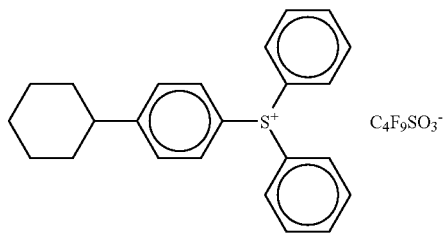
(z42) 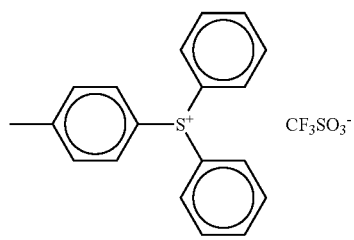
(z43) 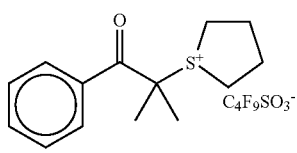
(z44) 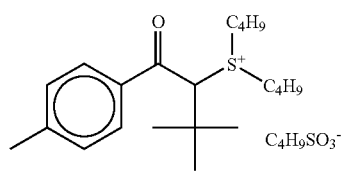
(z45) 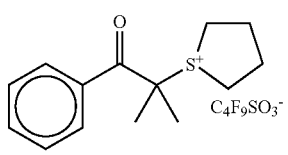
(z46) 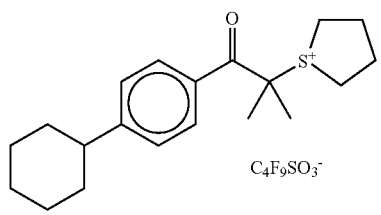
(z47) 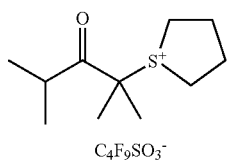

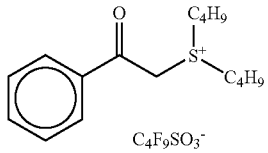
(z48)

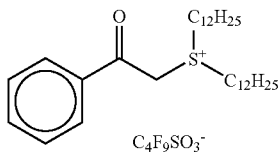
(z50)

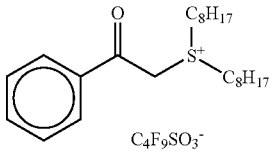
(z49)

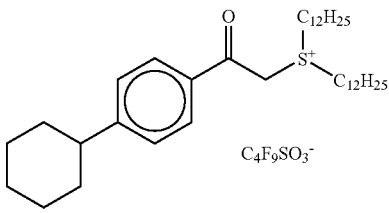
(z51)

An amount of the photo-acid generator added is ordinarily in a range of from 0.001 to 30% by weight, preferably in a range of from 0.3 to 20% by weight, and more preferably in a range of from 0.5 to 10% by weight, based on the solid content of the resist composition.

The amount of the photo-acid generator added of 0.001% by weight or more is preferred in view of sensitivity. On the other hand, the amount thereof added of 30% by weight or less make it possible to maintain light absorption of the resist composition in a low level and it is preferred in view of profile and process margin (particularly bake margin).

According to the invention, the compound that is decomposed to generate a sulfonic acid upon irradiation of an actinic ray or radiation is preferably used.

[3] Other Additives

The positive resist composition of the invention may further contain other additives including, for example, a surfactant, an organic basic compound, an acid-decomposable dissolution inhibiting compound, a dye, a plasticizer, a photo-sensitizer and a compound capable of accelerating dissolution in developing solution, if desired.

(a) Surfactant

The positive resist composition of the invention preferably includes a surfactant, particularly, one or more of a fluorine-based surfactant, a silicon-based surfactant and a surfactant containing both a fluorine atom and a silicon atom.

The incorporation of the surfactant into the positive resist composition of the invention is especially effective for reproduction of pattern having narrower linewidth and more restrains the occurrence of development defect.

Examples of the fluorine-based and/or silicon-based surfactant include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants as described below can also be used as they are.

Examples of the commercially available fluorine-based and/or silicon-based surfactant used include fluorine-based or silicon-based surfactants, for example, Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.) and Troysol S-366 (manufactured by Troy Chemical Corp.). A polysiloxane polymer KP-341. (manufactured by Shin-Etsu Chemical Co., Ltd.) is also used as a silicon-based surfactant.

Besides the above described known surfactants, a fluorine-based and/or silicon-based surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene))acrylate and/or (poly(oxyalkylene))methacrylate is preferred. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting group) or poly(oxyethylene-oxypropylene block connecting group) may be used. Further, the copolymer of a monomer having a fluoroaliphatic group with a (poly(oxyalkylene)) acrylate (or methacrylate) may be not only a binary copolymer but also a ternary or more component-containing copolymer obtained by copolymerizing simultaneously two or more different monomers having a fluoroaliphatic group with two or more different (poly(oxyalkylene))acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene))acrylate (or methacrylate), copolymers of acrylate (or methacrylate) having a $C_6F_{13}$ group, (poly(oxyethylene))acrylate (or methacrylate) and (poly(oxypropylene))acrylate (or methacrylate), copolymers of acrylate (or methacrylate) having a $C_8F_{17}$ group and (poly(oxyalkylene))acrylate (or methacrylate), copolymers of acrylate (or methacrylate) having a $C_8F_{17}$ group, (poly(oxyethylene))acrylate (or methacrylate) and (poly(oxypropylene))acrylate (or methacrylate are exemplified.

The amount of the surfactant used is preferably from 0.0001 to 2% by weight, more preferably from 0.001 to 1% by weight, and particularly preferably from 0.01 to 1% by weight, based on the total amount of the positive resist composition (excluding a solvent).

The surfactants used other than those described above include nonionic surfactants, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

(b) Organic Basic Compound

The positive resist composition of the invention preferably includes an organic basic compound. A preferred organic basic compound is a compound having basicity stronger than phenol. Further, a nitrogen-containing basic compound is preferably used. Examples of the organic nitrogen-containing basic compound include those having a structure represented by any one of formulae (A) to (E) shown below.

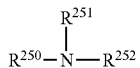
(A)

wherein, $R^{250}$, $R^{251}$ and $R^{252}$ each independently represent a hydrogen atom, an alkyl group having from 1 to 20 carbon atoms, an cycloalkyl group having from 3 to 20 carbon atoms or an aryl group having from 6 to 20 carbon atoms. $R^{251}$ and $R^{252}$ may be combined with each other to form a ring. The alkyl group, cycloalkyl group or aryl group may have a substituent. Examples of the alkyl group having a substituent include an aminoalkyl group having from 1 to 20 carbon atoms and a hydroxyalkyl group having from 1 to 20 carbon atoms. Examples of the cycloalkyl group having a substituent include an aminocycloalkyl group having from 3 to 20 carbon atoms and a hydroxycycloalkyl group having from 3 to 20 carbon atoms.

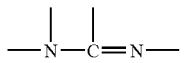
(B)

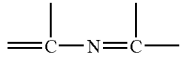
(C)

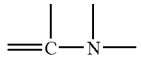
(D)

-continued

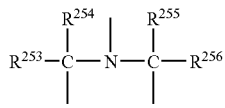
(E)

wherein $R^{253}$, $R^{254}$, $R^{255}$ and $R^{256}$ each independently represent an alkyl group having from 1 to 20 carbon atoms. The organic basic compound is more preferably a nitrogen-containing basic compound having two or more nitrogen atoms having chemical environment different from each other in one molecule, and particularly preferably a compound having both a substituted or unsubstituted amino group and a ring structure containing a nitrogen atom or a compound having an alkylamino group. Preferred examples of the compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or un-substituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Preferred specific examples of the nitrogen-containing basic compound include guanidine, 1,1-dimethylguanidine, 1,1,3,3-tetramethylguanidine, imidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperdinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]non-5-ene, 1,8-diazabicyclo[5.4.0]undec-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, a tertiary morpholine derivative, e.g., cyclohexylmorpholinoethyl thiourea (CHMETU), a hindered amine described in JP-A-11-52575 (e.g., compounds described in paragraph [0005]), but the nitrogen-containing basic compound should not be construed as being limited thereto.

Particularly preferred specific examples thereof include 1,5-diazabicyclo[4.3.0]non-5-ene, 1,8-diazabicyclo[5.4.0]undec-7-ene, 1,4-diazabicyclo [2.2.2]octane, 4-dimethylaminopyridine, hexamethylenetetramine, 4,4-dimethylimidazoline, a pyrrole, a pyrazole, an imidazole, a pyridazine, a pyrimidine, a tertiary morpholine derivative, e.g., CHMETU, a hindered amine, e.g., bis(1,2,2,6,6-pentamethyl-4-piperidyl)sebacate, N,N-dihydroxyethylaniline, N,N-dibutylaniline, trioctylamine, triphenylimidazole, antipyrine and 2,6-diisopropylamine.

Among these, 1,5-diazabicyclo[4.3.0]non-5-ene, 1,8-diazabicyclo[5.4.0]undec-7-ene, 1,4-diazabicylour[2.2.2]octane, 4-dimethylaminopyridine, hexamethylenetetramine, CHMETU, bis(1,2,2,6,6-pentamethyl-4-piperidyl)sebacate, N,N-dihydroxyethylaniline, N,N-dibutylaniline, trioctylamine, triphenylimidazole, antipyrine and 2,6-diisopropylamine are preferred.

The organic basic compounds may be used individually or as a mixture of two or more thereof. An amount of the organic basic compound used is ordinarily from 0.001 to 10% by weight, and preferably from 0.01 to 5% by weight, based on the solid content of the positive resist composition. The amount in the above range is favorable because an effect of the addition of organic basic compound is sufficiently obtained while maintaining the balance between sensitivity and developing property in the unexposed area.

[4] Solvent

The positive resist composition of the invention is used by dissolving the above-described components in a solvent capable of dissolving them and coated on a support. The solvent used preferably includes ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether (PGME), propylene glycol monomethyl ether acetate (PGMEA), ethylene carbonate, toluene, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. The solvents may be used individually or as a mixture of two or more thereof.

Of the above solvents, propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, ethylene carbonate, butyl acetate, m-ethyl lactate, ethyl lactate, methyl methoxypropionate, ethyl ethoxypropionate, N-methylpyrrolidone and tetrahydrofuran are more preferred.

In the positive resist composition prepared by dissolving the respective components in a solvent, concentration of the total solid content is preferably from 3 to 25% by weight, more from 5 to 22% by weight, and still more from 7 to 20% by weight.

The positive resist composition of the invention is coated on a substrate to form a thin film. The coated film preferably has a film thickness of from 0.2 to 1.2 μm.

The substrate that can be used includes, for example, a conventional Bare Si substrate or SOG substrate and a substrate having an inorganic or organic anti-reflective coating described below.

Further, a commercially available inorganic or organic anti-reflective coating can be used, if desired.

As the anti-reflective coating used, any of an inorganic film type comprising, for example, titanium, titanium dioxide, titanium nitride, chromium oxide, carbon or amorphous silicon and an organic film type comprising a light absorber and a polymer material can be used. The former requires equipment, for example, a vacuum vapor deposition apparatus, a CVD apparatus or a sputtering apparatus in the film formation. Examples of the organic anti-reflective coating include anti-reflective coating comprising a condensate of a diphenylamine derivative and a formaldehyde-modified melamine resin, an alkali-soluble resin and a light absorber as described in JP-B-7-69611 (the term "JP-B" as used herein means an "examined Japanese patent publication"); anti-reflective coating comprising a reaction product of a maleic anhydride copolymer and a diamine type light absorber as described in U.S. Pat. No. 5,294,680; anti-reflective coating comprising a resin binder and a methylolmelamine based thermal crosslinking agent as described in JP-A-6-118631; acrylic resin type anti-reflective coating containing a carboxylic acid group, an epoxy group and a light absorbing group in the same molecule as described in JP-A-6-118656; anti-reflective coating comprising methylolmelamine and a benzophenone based light absorber as described in JP-A-8-87115; and anti-reflective coating comprising a polyvinyl alcohol resin having a low-molecular light absorber added thereto as described in JP-A-8-179509.

Also, commercially available anti-reflective coating, for example, DUV30 Series, DUV40 Series or ARC25 manufactured by Brewer Science, Inc. and AC-2, AC-3, AR-19 or AR-20 manufactured by Shipley Company, LLC can be used as the organic anti-reflective coating.

The positive resist composition is applied to a substrate (e.g., silicon/silicon dioxide coating) as used for the production of a precise integrated circuit device or a substrate provided thereon the anti-reflective coating described above, if desired, by appropriate application means, for example, spinner or coater, and dried to form a resist film. Then, the resist film is exposed to light through an appropriate mask and subjected to baking and development, whereby good resist patterns are obtained. The light for exposure is preferably light having a wavelength of from 150 nm to 250 nm. Specific examples thereof include KrF excimer laser beam (248 nm), ArF excimer laser beam (193 nm), $F_2$ excimer laser beam (157 nm), an X-ray and an electron beam.

A developing solution used includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine (content thereof being ordinarily from 0.1 to 10% by weight).

A developing solution prepared by adding an appropriate amount of an alcohol or a surfactant to the aqueous alkaline solution is also used.

The present invention is described in more detail with reference to the following examples, but the present invention should not be construed as being limited thereto.

In the following synthesis examples, the terms "ratio" and "part" mean ratio by weight and part by weight, respectively, unless otherwise indicated.

SYNTHESIS EXAMPLE 1

Synthesis of Resin (1)

2-Adamantyl-2-propyl methacrylate, 3,5-dihydroxy-1-adamantyl methacrylate, norbornane lactone acrylate and methacrylic acid in a molar ratio of 30/20/40/10 were dissolved in a mixed solvent of propylene glycol monomethyl ether acetate and propylene glycol monomethyl ether (70/30) to prepare 450 g of a solution having a solid concentration of 22%. To the solution was added 1% by mole of V-601 manufactured by Wako Pure Chemical Industries, Ltd. as a polymerization initiator, and the solution was added dropwise to 50 g of a mixed solvent of propylene glycol monomethyl ether acetate and propylene glycol monomethyl ether (70/30) heated at 100° C. under nitrogen atmosphere over a period of 6 hours. After the completion of the addition, the reaction solution was stirred for 2 hours. After the termination of the reaction, the reaction solution was cooled to room temperature and poured into 5 liters of a mixed solvent of hexane and ethyl acetate (9/1) to crystallize, and the white powder deposited was collected by filtration to recover the desired Resin (1).

A monomer composition ratio (by mole) of the resin was determined by $C^{13}$NMR. The ratio of 2-adamantyl-2-propyl methacrylate/3,5-dihydroxy-1-adamantyl methacrylate/norbornane lactone acrylate/methacrylic acid was in 32/21/37/10. An acid value thereof was 0.45. A weight average molecular weight thereof measured by GPC method and calculated in terms of standard polystyrene was 7,800 and a degree of dispersion was 2.0.

Resins (1'), (1"), (2) to (15), (Comparison 1A) and (Comparison 1B) were synthesized in a similar manner to Synthesis Example (1), respectively. Resins (1'), (1"), (Comparison 1A) and (Comparison 1B) have the same repeating units as in Resin (1), but are different from Resin (1) in the composition ratio thereof, etc.

The structure, monomer composition ratio, weight average molecular weight, degree of dispersion and acid value are shown below.

(1)

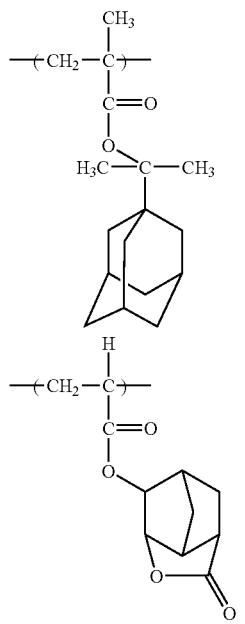
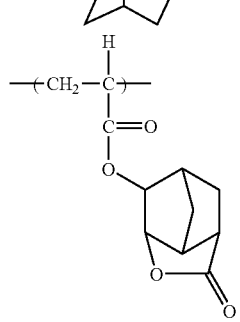
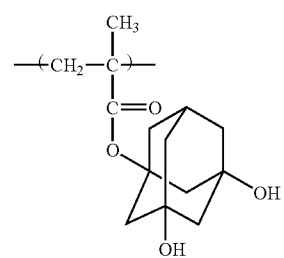
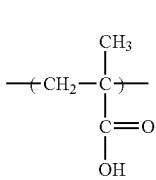

(2)

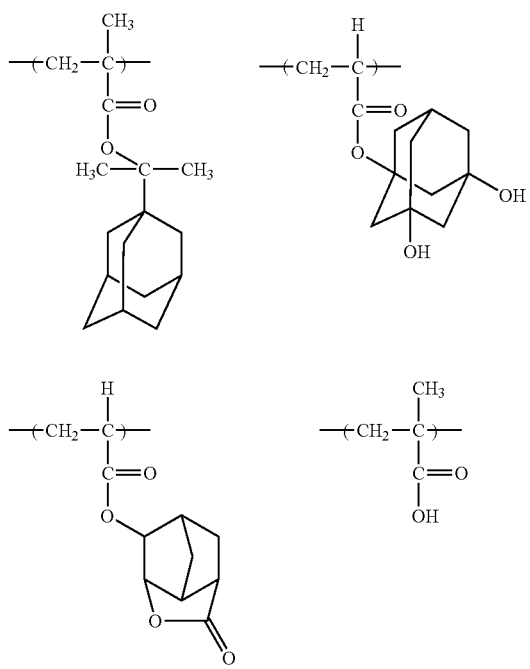

(3)

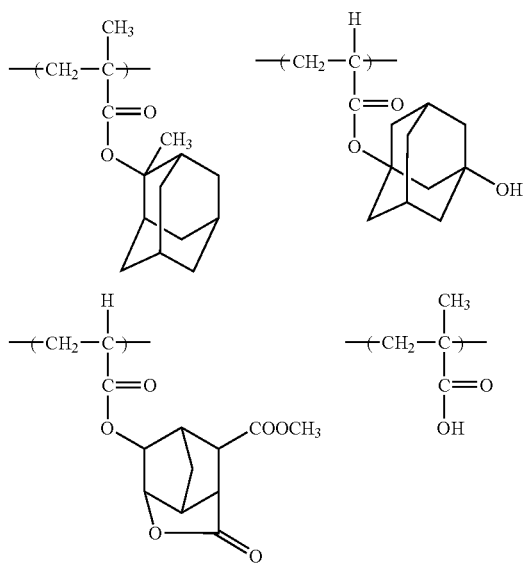

(4)

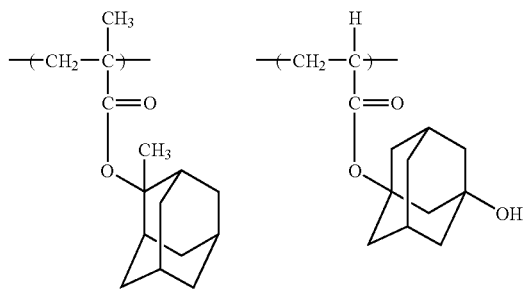

-continued
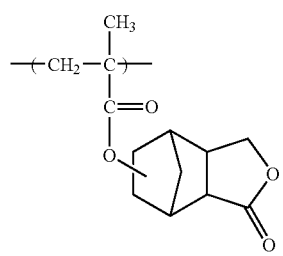 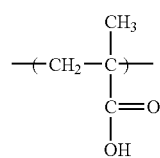
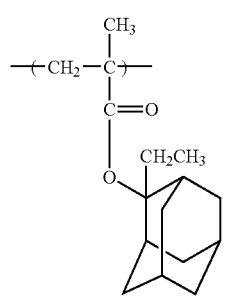
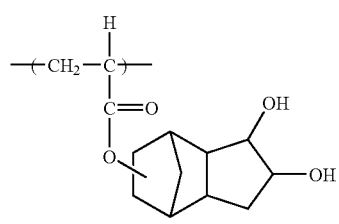
(6)
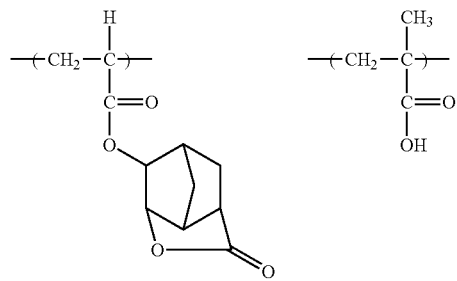
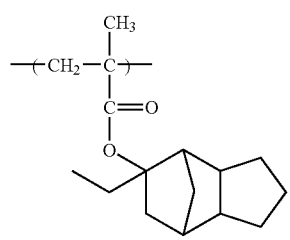
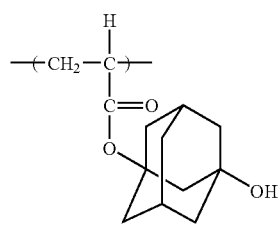
-continued
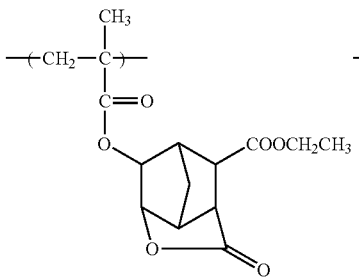 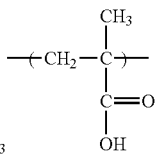
(5)
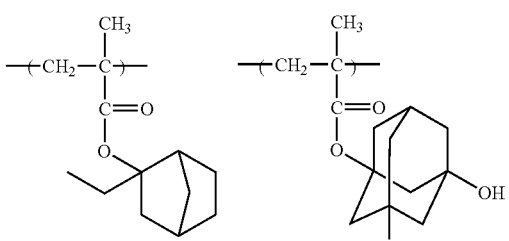
(7)
(8)
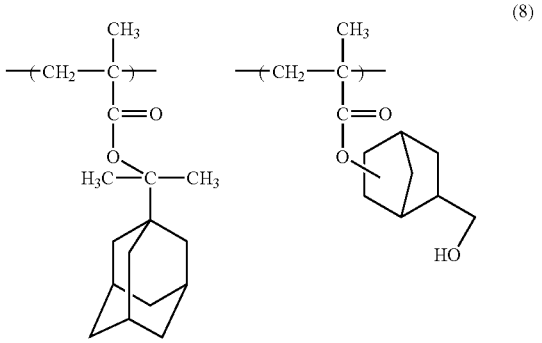
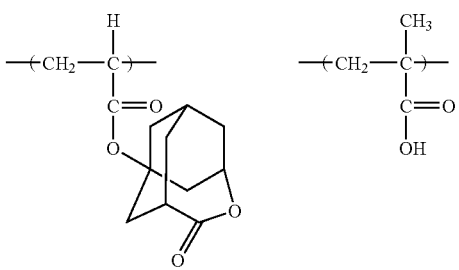

(9)
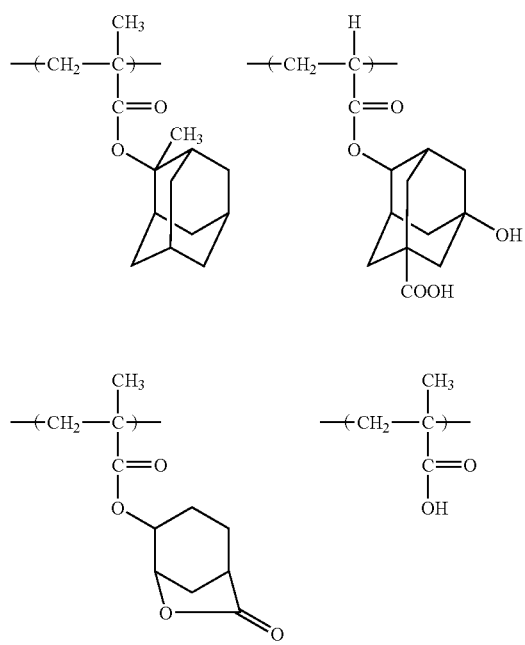
(10)
(11)
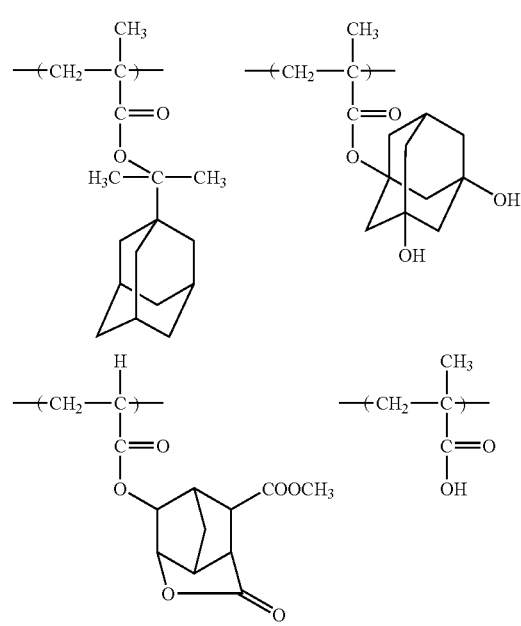
(12)
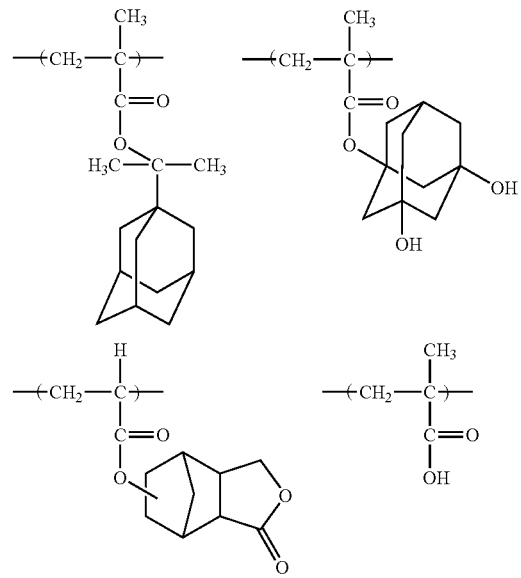
(13)
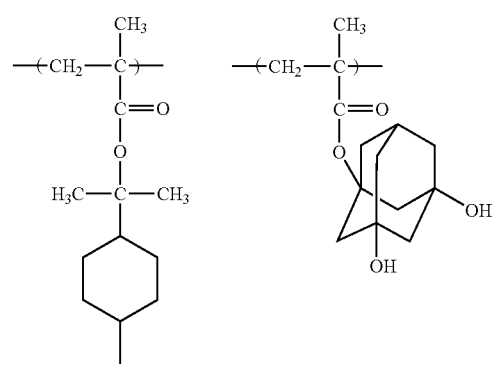

-continued
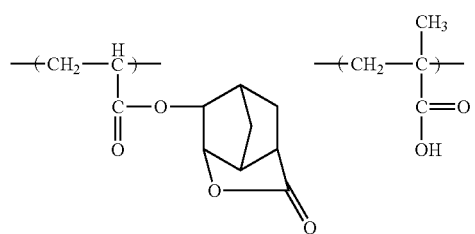
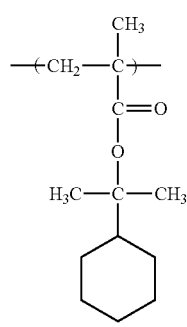 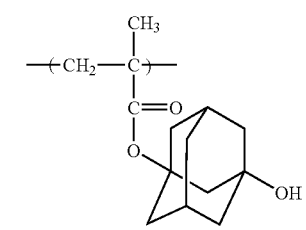
(14)
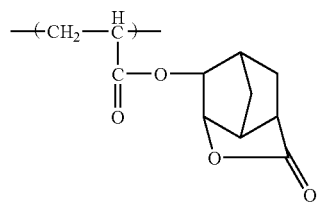 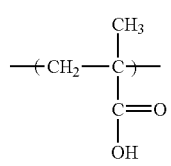
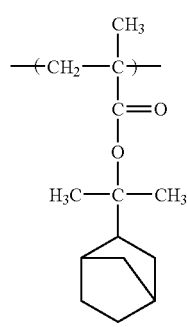 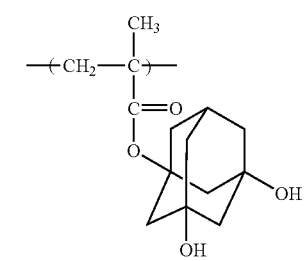
(15)
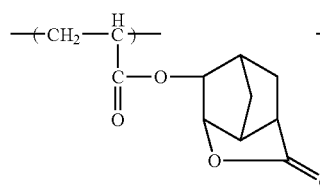 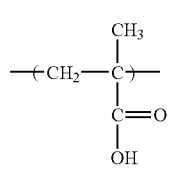
-continued
(16)
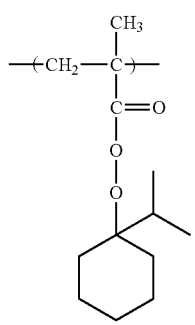 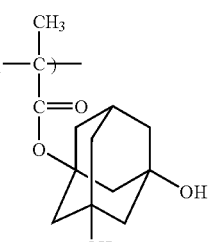
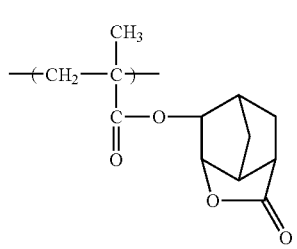 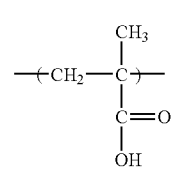
(17)
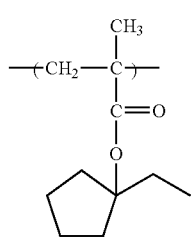 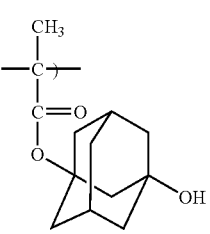
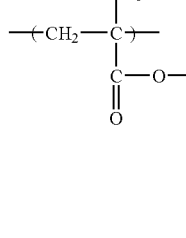 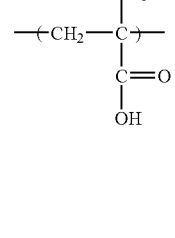
(18)
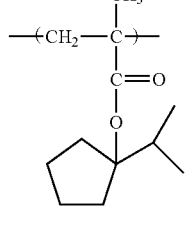 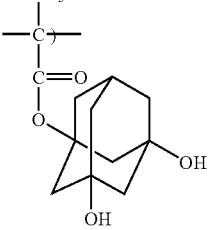
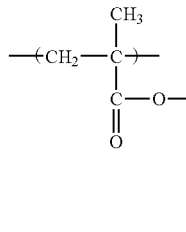 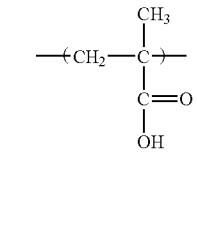

-continued

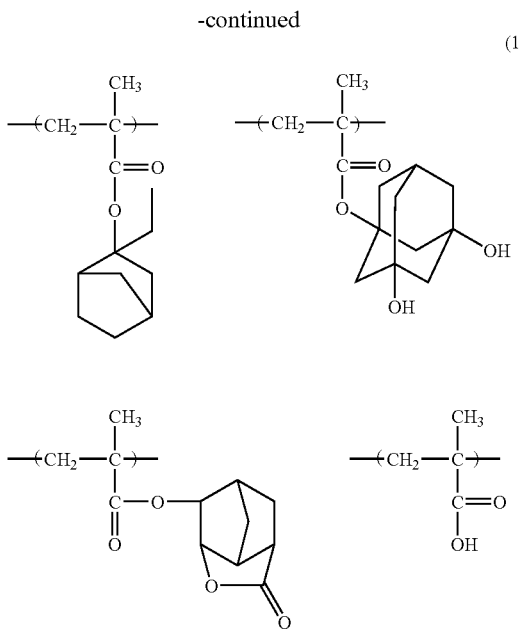

(19)

in Table 2 below, 4 mg of an organic basic compound and 10 mg of a surfactant were blended as shown in Table 2 and dissolved in a solvent shown in Table 2 to prepare a solution having a solid content of 10% by weight, then the resulting solution was filtered through a polyethylene filter having a pore size of 0.1 μm, whereby a positive resist composition was prepared. In the case of using plural compounds of each component, a ratio of the compounds was indicated by weight in Table 2.

[Evaluation]

An anti-reflective coating (ARC-29 manufactured by Brewer Science, Inc.) was coated on a silicon wafer at a thickness of 85 nm by a spin coater and dried. Then, each of the positive resist compositions described above was coated thereon by a spin coater and dried (PB) at temperature shown in Table 2 for 90 seconds to form a positive resist film having a thickness of 280 nm. The positive resist film was subjected to exposure with an ArF excimer laser beam (PAS5500/1100 Stepper manufacture by ASML Co., Ltd.; NA: 0.75). The exposed positive resist film was subjected to heat treatment after exposure (PEB) at temperature shown in Table 2 for 90 seconds, developed with a 2.38% by weight aqueous tetramethylammonium hydroxide solution, and rinsed with distilled water to obtain a resist pattern profile.

TABLE 1

| Resin | Composition Ratio | | | | Weight Average Molecular Weight | Degree of Dispersion (Mw/Mn) | Acid Value (meq/g) |
|---|---|---|---|---|---|---|---|
| | Repeating Unit (a) | Repeating Unit (b) | Repeating Unit (c) | Repeating Unit (d) | | | |
| 1 | 32 | 21 | 37 | 10 | 7,800 | 2.0 | 0.45 |
| 1' | 25 | 19 | 35 | 16 | 8,200 | 2.1 | 0.80 |
| 1" | 31 | 19 | 33 | 17 | 8,300 | 2.1 | 0.80 |
| 2 | 31 | 20 | 36 | 13 | 8,200 | 2.1 | 0.60 |
| 3 | 39 | 27 | 23 | 11 | 8,300 | 2.2 | 0.50 |
| 4 | 38 | 23 | 28 | 11 | 8,100 | 2.0 | 0.53 |
| 5 | 30 | 19 | 43 | 8 | 8,200 | 2.3 | 0.29 |
| 6 | 39 | 24 | 24 | 13 | 7,900 | 2.2 | 0.59 |
| 7 | 41 | 22 | 31 | 6 | 8,300 | 2.1 | 0.43 |
| 8 | 29 | 23 | 34 | 14 | 8,100 | 2.4 | 0.66 |
| 9 | 40 | 17 | 38 | 5 | 7,800 | 2.1 | 0.22 (0.97*) |
| 10 | 34 | 28 | 26 | 12 | 7,700 | 2.4 | 0.50 |
| 11 | 32 | 21 | 36 | 11 | 7,800 | 1.9 | 0.45 |
| 12 | 32 | 22 | 34 | 12 | 8,200 | 2.1 | 0.54 |
| 13 | 29 | 21 | 41 | 9 | 7,800 | 2.0 | 0.43 |
| 14 | 35 | 25 | 32 | 8 | 8,400 | 2.3 | 0.39 |
| 15 | 31 | 21 | 37 | 11 | 8,300 | 2.2 | 0.53 |
| 16 | 41 | 18 | 31 | 10 | 8,800 | 2.3 | 0.49 |
| 17 | 39 | 19 | 33 | 9 | 9,200 | 2.4 | 0.46 |
| 18 | 42 | 16 | 31 | 11 | 8,600 | 2.2 | 0.55 |
| 19 | 37 | 18 | 35 | 10 | 8,300 | 2.4 | 0.48 |
| Comparison 1A | 42 | 16 | 39 | 3 | 8,100 | 2.1 | 0.13 |
| Comparison 1B | 29 | 21 | 30 | 20 | 8,000 | 2.1 | 0.96 |

*value including an acid value of the repeating unit containing an alicyclic structure substituted with a hydroxy group.

EXAMPLES 1 TO 21 AND COMPARATIVE EXAMPLES 1 TO 2

(Preparation and Evaluation of Positive Resist Composition)

In each of Examples 1 to 21 and Comparative Examples 1 to 2, 2 g of the resin synthesized in the above-described synthesis example, an acid generator in an amount as shown

[Process Window]

The exposure was conducted using a halftone phase-contrast shift mask having transmittance of 6% in an optimum exposure amount $E_o$, that is, an exposure amount necessary for reproducing line pattern of mask size of 140 nm (280 nm pitch) to 120 nm. Under conditions of ±0.3 μm defocusing from the best focus, the maximum exposure amount $E_1$ and the minimum exposure amount $E_2$ necessary for reproducing linewidth of 120±10% were determined, and the process window was defined as follows:

Process Window (%)=$(E_1-E_2)\times 100/E_o$

The results obtained are shown in Table 2.

[Formation of Pit at Flow Bake]

A pattern having hole size of 120 nm was formed using a contact hole pattern (mask size of 140 nm) having a hole/duty ratio of 1/2.

Each wafer was cut into 8 pieces. The pieces were heated on hot plates heated at 150° C., 155° C., 160° C., 165° C., 170° C., 175° C., 180° C., 185° C., respectively, for 90 seconds. The cross-section of contact hole was observed by a scanning electron microscope, and presence or absence of pit formed was determined. The absence of pit formed is most preferred. Among the cases where the formation of pit was confirmed, the higher the temperature for forming pit, the better. Of 8 pieces in each of the examples, the lowest temperature at which the formation of pit was observed is shown in Table 2. The example in which the formation of pit was not observed under the whole flow bake conditions is shown as "None" in Table 2.

TABLE 2

| | | Composition | | | | | Evaluation | |
| --- | --- | --- | --- | --- | --- | --- | --- | --- |
| | Resin | Photo-Acid Generator | Solvent (weight ratio) | Organic Basic Compound (weight ratio) | Surfactant | Condition PB/PEB (° C.) | Process Window (%) | Formation of Pit |
| Example 1 | 1 | z46 78 mg | S1/S2 (60/40) | 2 | 5 | 115/115 | 9 | 180° C. |
| Example 2 | 1' | z46 78 mg | S1/S2 (60/40) | 2 | 5 | 115/115 | 12 | None |
| Example 3 | 1" | z46 78 mg | S1/S2 (60/40) | 2 | 5 | 115/115 | 11 | 185° C. |
| Example 4 | 2 | z41/z46 8 mg/75 mg | S1/S2 (60/40) | 1 | 5 | 115/115 | 9 | 180° C. |
| Example 5 | 3 | z5/z46 4 mg/77 mg | S1/S4 (60/40) | 2 | 5 | 130/130 | 8 | 175° C. |
| Example 6 | 4 | z46 90 mg | S1/S3 (95/5) | 2 | 5 | 130/130 | 8 | 175° C. |
| Example 7 | 5 | z41 55 mg | S5/S6 (60/40) | 3 | 1 | 115/115 | 8 | 180° C. |
| Example 8 | 6 | z14/z46 20 mg/58 mg | S1/S2 (60/40) | 4 | 2 | 130/130 | 8 | 175° C. |
| Example 9 | 7 | z14 55 mg | S1/S4 (60/40) | 6 | 3 | 130/130 | 8 | 175° C. |
| Example 10 | 8 | z33/z46 32 mg/44 mg | S1/S2 (60/40) | 5 | 3 | 115/115 | 9 | 180° C. |
| Example 11 | 9 | z46 86 mg | S1/S2 (60/40) | 1/6 (1/1) | 3 | 130/130 | 9 | 175° C. |
| Example 12 | 10 | z41 55 mg | S1/S2 (60/40) | 2 | 4 | 130/130 | 8 | 180° C. |
| Example 13 | 11 | z46 84 mg | S1/S2 (60/40) | 2 | 5 | 115/115 | 8.5 | 180° C. |
| Example 14 | 12 | z46 75 mg | S1/S2 (60/40) | 2 | 5 | 115/115 | 8.5 | 180° C. |
| Example 15 | 13 | z41/z46 28 mg/22 mg | S1/S2 (60/40) | 2 | 5 | 115/120 | 10.5 | None |
| Example 16 | 14 | z41 42 mg | S1/S2 (60/40) | 2 | 5 | 115/120 | 8.5 | None |
| Example 17 | 15 | z41/z46 30 mg/22 mg | S1/S2 (60/40) | 2 | 5 | 115/120 | 10 | None |
| Example 18 | 16 | z46 78 mg | S1/S2 (60/40) | 2 | 5 | 120/120 | 9 | None |
| Example 19 | 17 | z46 78 mg | S1/S2 (60/40) | 2 | 5 | 120/120 | 9 | None |
| Example 20 | 18 | z46 78 mg | S1/S2 (60/40) | 2 | 5 | 120/120 | 9.5 | None |
| Example 21 | 19 | z46 78 mg | S1/S2 (60/40) | 2 | 5 | 120/120 | 8.5 | None |
| Comparative Example 1 | Comparison 1A | z46 78 mg | S1/S2 (60/40) | 2 | 5 | 115/115 | 5 | 155° C. |
| Comparative Example 2 | Comparison 1B | z46 78 mg | S1/S2 (60/40) | 2 | 5 | 115/115 | 3 | 170° C. |

The symbols shown in Table 2 represent the following components, respectively.

[Photo-Acid Generator]

The symbols shown in Table 2 correspond to the specific examples of photo-acid generator (PAG) described hereinbefore, respectively.

[Surfactant]

1: Megafac F176 (manufactured by Dainippon Ink and Chemicals, Inc.) (fluorine-based)

2: Megafac R08 (manufactured by Dainippon Ink and Chemicals, Inc.) (fluorine-based and silicon-based)

3: Polysiloxane Polymer KP-341 (manufactured by Shin-Etsu Chemical Co., Ltd.)
4: Polyoxyethylene nonyl phenyl ether
5: Troysol S-366 (manufactured by Troy Chemical Co., Ltd.)

[Organic Basic Compound]
1: N,N-Dihydroxyethylaniline
2: N,N-Dibutylaniline
3: Trioctylamine
4: Triphenylimidazole
5: Antipyrine
6: 2,6-Diisopropylaniline

[Solvent]
S1: Propylene glycol methyl ether acetate
S2: Propylene glycol methyl ether
S3: γ-Butyrolactone
S4: Cyclohexanone
S5: Ethyl lactate
S6: Butyl acetate It is apparent from the results shown in Table 2 that the positive resist composition of the present invention provides a wide process window in the formation of contact hole and restrains the formation of pit at the flow bake.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a resin that increases solubility in a developing solution by the action of an acid and comprises (a) a repeating unit containing a group that is decomposed by the action of an acid to become alkali-soluble, (b) a repeating unit containing an alicyclic lactone structure, (c) a repeating unit containing an alicyclic structure substituted with a hydroxy group and (d) a methacrylic acid repeating unit, wherein an amount of the methacrylic acid repeating unit is from 5 to 18% by mole based on the total repeating units of the resin, and (B) a compound that generates an acid upon irradiation of an actinic ray or radiation.

2. The positive resist composition as claimed in claim 1, wherein the repeating unit (a) containing a group that is decomposed by the action of an acid to become alkali-soluble contains an alicyclic structure.

3. The positive resist composition as claimed in claim 2, wherein the repeating unit (a) containing a group that is decomposed by the action of an acid to become alkali-soluble is represented by the following formula (I):

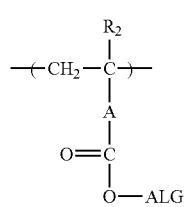

(I)

wherein $R_2$ represents a hydrogen atom or a methyl group; A represents a single bond or a connecting group; and ALG represents a group containing an alicyclic hydrocarbon represented by any one of the following formulae (pI) to (pV):

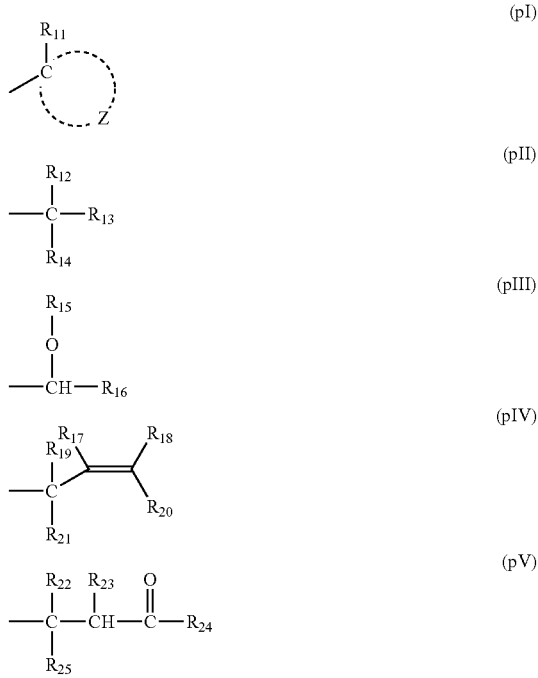

wherein $R_{11}$ represents a methyl group, an ethyl group, a n-propyl group, an isopropyl group, a n-butyl group, an isobutyl group or a sec-butyl group, Z represents an atomic group necessary for forming an alicyclic hydrocarbon group together with the carbon atom, $R_{12}$ to $R_{16}$ each independently represent a straight chain or branched alkyl group having from 1 to 4 carbon atoms or an alicyclic hydrocarbon group, provided that at least one of $R_{12}$ to $R_{14}$ or either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group and that either $R_{19}$ or $R_{21}$ represents a straight chain or branched alkyl group having from 1 to 4 carbon atoms or an alicyclic hydrocarbon group; $R_{22}$ to $R_{25}$ each independently represent a hydrogen atom, a straight chain or branched alkyl-group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring.

4. The positive resist composition as claimed in claim 1, wherein an acid value of the resin (A) is from 0.2 meq/g to 0.9 meq/g.

5. The positive resist composition as claimed in claim 1, wherein a content of the repeating unit (a) having an acid-decomposable group is from 18 to 55% by mole based on the total repeating units of the resin (A).

6. The positive resist composition as claimed in claim 1, wherein a content of the repeating unit (b) having an alicyclic lactone structure is from 15 to 60% by mole based on the total repeating units of the resin (A).

7. The positive resist composition as claimed in claim 1, wherein a content of the repeating unit (c) having an alicyclic structure substituted with a hydroxy group is from 5 to 40% by mole based on the total repeating units of the resin (A).

8. A method of forming a pattern comprising a step of forming a resist film with the positive resist composition as claimed in claim 1, a step of exposing the resist film, and a step of developing the exposed resist film.

9. The positive resist composition as claimed in claim 1, wherein the alicyclic lactone structure in the repeating unit (b) is selected from the group consisting of a cyclohexane lactone, a norbornane lactone, and an adamantane lactone.

* * * * *